United States Patent
Cao et al.

(10) Patent No.: US 10,152,159 B2
(45) Date of Patent: Dec. 11, 2018

(54) DISPLAY PANEL AND METHOD FOR FORMING AN ARRAY SUBSTRATE OF A DISPLAY PANEL

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Zhaokeng Cao, Shanghai (CN); Huijun Jin, Shanghai (CN); Xiaoye Li, Shanghai (CN); Huangyao Wu, Xiamen (CN); Di Zhu, Shanghai (CN)

(73) Assignees: SHANGHAI TIANMA MICRO-ELECTRONICS, Shanghai (CN); TIANMA MICRO-ELECTRONICS CO/. LTD., Shenzhen (CN)

( * ) Notice: Subject to any disclaimer, the term of this patent is extended or adjusted under 35 U.S.C. 154(b) by 32 days.

(21) Appl. No.: 15/620,680

(22) Filed: Jun. 12, 2017

(65) Prior Publication Data

US 2017/0277326 A1    Sep. 28, 2017

Related U.S. Application Data

(63) Continuation-in-part of application No. 14/857,632, filed on Sep. 17, 2015, now Pat. No. 9,711,541.

(30) Foreign Application Priority Data

Apr. 1, 2015    (CN) .......................... 2015 1 0152796

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC . G06F 3/0412; H01L 27/1214; H01L 27/124; H01L 51/5203; H01L 33/36; G09G 2300/0426; H05K 1/0298
See application file for complete search history.

(56) References Cited

U.S. PATENT DOCUMENTS 6,850,307 B2    2/2005  Hinata
9,035,310 B2    5/2015  Ishii
(Continued)

FOREIGN PATENT DOCUMENTS

CN    201465087 U    5/2010
CN    103262012 A    8/2013
CN    103489879 A    1/2014

OTHER PUBLICATIONS

Chinese Application No. 201510152796.7, First Office Action dated Apr. 21, 2017.

*Primary Examiner* — Joseph C Nicely
(74) *Attorney, Agent, or Firm* — Alston & Bird LLP

(57) ABSTRACT

The present application provides a display panel. The display panel includes an array substrate which includes a display region and a frame region. The frame region includes a gate circuit drive unit, the gate circuit drive unit comprises a thin film transistor, and the thin film transistor comprises a source, a drain and a gate. The frame region further includes a driving circuit and a first signal lead line, the first signal lead line is arranged on a single layer and arranged on a same layer as the signal transmission wire layer, one end of the first signal lead line is electrically
(Continued)

connected to the gate and the other end of the first signal lead line is electrically connected to the driving circuit.

20 Claims, 35 Drawing Sheets

(51) Int. Cl.
    *G06F 3/044*         (2006.01)
    *G02F 1/1333*      (2006.01)
    *G09G 3/36*          (2006.01)
    *H01L 33/36*       (2010.01)
    *H01L 51/52*       (2006.01)
    *H05K 1/02*         (2006.01)
    *G02F 1/1362*      (2006.01)
    *G02F 1/1368*      (2006.01)
    *G02F 1/1343*      (2006.01)

(52) U.S. Cl.
    CPC ......... *G09G 3/3677* (2013.01); *H01L 27/124* (2013.01); *H01L 27/1214* (2013.01); *H01L 27/1259* (2013.01); *H01L 33/36* (2013.01); *H01L 51/5203* (2013.01); *H05K 1/0298* (2013.01); *G02F 1/1368* (2013.01); *G02F 1/13439* (2013.01); *G02F 1/133345* (2013.01); *G02F 1/134309* (2013.01); *G02F 1/136286* (2013.01); *G02F 2001/136295* (2013.01); *G02F 2201/121* (2013.01); *G02F 2201/123* (2013.01); *G06F 2203/04105* (2013.01); *G09G 2300/0426* (2013.01)

(56) References Cited

U.S. PATENT DOCUMENTS

| | | |
|---|---|---|
| 2007/0290967 A1 | 12/2007 | Jang |
| 2010/0156851 A1 | 6/2010 | Kurokawa |
| 2012/0105392 A1 | 5/2012 | Nagami |
| 2013/0258614 A1 | 10/2013 | Misaki |
| 2015/0378223 A1 | 12/2015 | Wen |
| 2016/0291424 A1 | 10/2016 | Sun et al. |
| 2016/0291722 A1 | 10/2016 | Du et al. |
| 2016/0293642 A1 | 10/2016 | Zhang et al. |
| 2016/0300863 A1 | 10/2016 | Koide et al. |
| 2017/0222059 A1* | 8/2017 | Chen ................ H01L 29/78633 |

* cited by examiner

DISPLAY PANEL AND METHOD FOR FORMING AN ARRAY SUBSTRATE OF A DISPLAY PANEL

CROSS-REFERENCE TO RELATED APPLICATIONS

The present application is a continuation-in-part of U.S. patent application Ser. No. 14/857,632, filed on Sep. 17, 2015, which claims priority to Chinese patent application No. CN201510152796.7, filed on Apr. 1, 2015, and entitled "ARRAY SUBSTRATE AND METHOD FOR FORMING THE SAME, DISPLAY PANEL". The entire disclosures of the above applications are incorporated herein by reference.

TECHNICAL FIELD

The present application generally relates to display technology, and more particularly, to a display panel and a method for forming an array substrate of a display panel.

BACKGROUND

With the development of display technology, more and more display panels are integrated with touch function to improve customer experience. There are mainly two kinds of touch techniques, mutual-capacitance technique and self-capacitance technique. Touch display devices using self-capacitance technique may only need one touch electrode layer. Therefore, compared with mutual-capacitance, self-capacitance technique is more adapted to the current trend as the market is chasing thinner and lighter display panels. Meanwhile, those skilled in the art are also trying to reduce the size of a frame region in a display panel, such that its display area can be made as large as possible when the entire surface size of the display panel is limited.

Currently, a display panel may include a display region and a frame region. Gates, sources, drains, common electrodes and pixel electrodes may be disposed in the display region, while drive circuits and wires are arranged in the frame region. The wires are used for coupling the drive circuits with the components in the display region. The width of the frame region is mainly depended on the width of a region for placing these wires. However, with the size and resolution of display panels becoming greater and greater, nowadays a display panel needs to accommodate more pixel electrodes. As a result, the number of wires for connecting the pixel electrodes also increases, which refers to the width of the frame region is not likely to decrease.

SUMMARY

The present disclosure provides a display panel and a method for forming an array substrate of a display panel. The array substrate may have a frame region with a smaller size.

According to disclosed embodiments, a display panel including an array substrate is provided. The array substrate includes a display region and a frame region. The frame region includes a drive circuit region and a wire region. Wires formed in the wire region are configured to electrically connect components in the drive circuit region to components in the display region. In the wire region, there are formed a plurality of first signal wires each of which includes a first conductive layer stacked with a second conductive layer. A first insulating layer is disposed between the first and the second conductive layers. There is also a first via between the first and the second conductive layers, through which the first and the second conductive layers are electrically connected. One layer stacked with another layer refers to that the two layers are at least partially overlapped with each other in a direction perpendicular to the array substrate. However, more than two layers stacked with each other refers to that each layer is at least partially overlapped with at least another one of the layers in the direction perpendicular to the array substrate.

According to disclosed embodiments, a method for forming an array substrate of a display panel is provided. The method includes: providing a first substrate; forming a first conductive layer in a first signal wire region of a wire region, where the wire region is disposed on a first surface of the first substrate; forming a first insulating layer overlaying the first conductive layer; forming a first via in the first insulating layer, where the first via is in contact with the first conductive layer; and forming a second conductive layer on the first insulating layer, where the first and the second conductive layers are electrically connected through the first via.

According to disclosed embodiments, a display panel is provided. The display panel includes the above array substrate.

According to disclosed embodiments, a display panel is provided. The display panel includes an array substrate. The array substrate includes a display region and a frame region. The display region includes a signal transmission wire layer. The frame region includes a gate circuit drive unit. The gate circuit drive unit includes a thin film transistor, and the thin film transistor includes a source, a drain and a gate. The frame region further includes a driving circuit and a first signal lead line. The first signal lead line is arranged on a single layer and arranged on a same layer as the signal transmission wire layer of the display region. One end of the first signal lead line is electrically connected to the gate, and the other end of the first signal lead line is electrically connected to the driving circuit.

According to disclosed embodiments, a touch control display device is provided. The device includes the above touch panel.

BRIEF DESCRIPTION OF THE DRAWINGS

The drawings to be used in the description of embodiments or the conventional technology are described briefly as follows, so that technical solutions according to the embodiments of the present disclosure or according to the conventional technology may become clearer. It is obvious that the drawings in the following description only illustrate some embodiments of the present disclosure. For those skilled in the art, other drawings may be obtained based on these drawings without any creative work.

DETAILED DESCRIPTION

Technical solutions according to embodiments of the present disclosure are described clearly and completely hereinafter in conjunction with the drawings. It is obvious that the described embodiments are only a part rather than all of the embodiments according to the present disclosure. Any other embodiments obtained by those skilled in the art based on the embodiments in the present disclosure without any creative work fall in the scope of the present disclosure.

Numerous specific details are set forth in the following descriptions to facilitate a thorough understanding of the present disclosure. The present disclosure can be implemented by embodiments otherwise than the embodiments as described herein, and those skilled in the art can make similar equivalents without departing from the meaning of the present disclosure. Therefore, the present disclosure is not limited by specific embodiments disclosed below.

Figure 1:
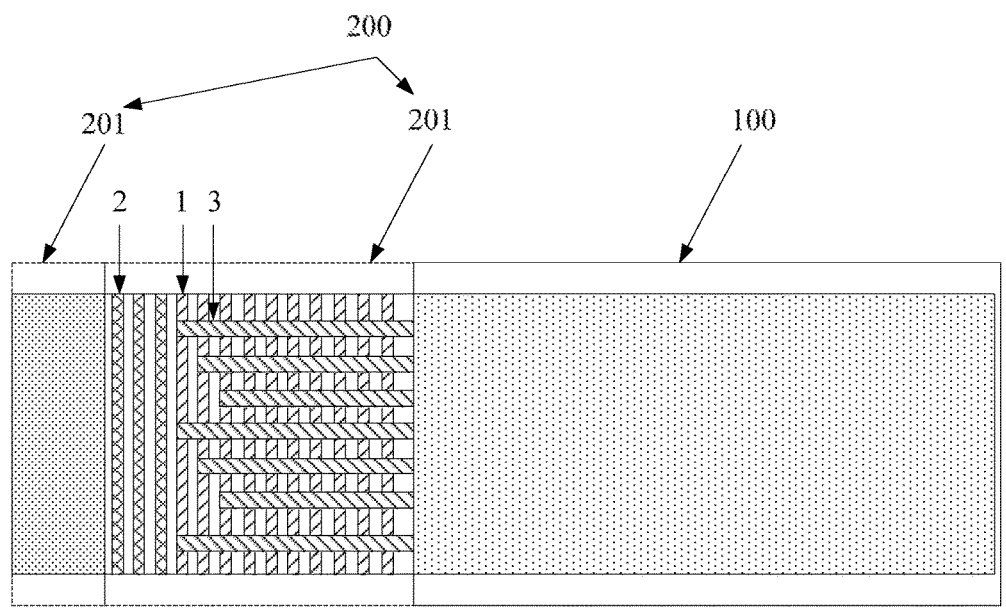
FIG. 1 is a top view of an array substrate according to an embodiment of the present disclosure.
Figure 2:
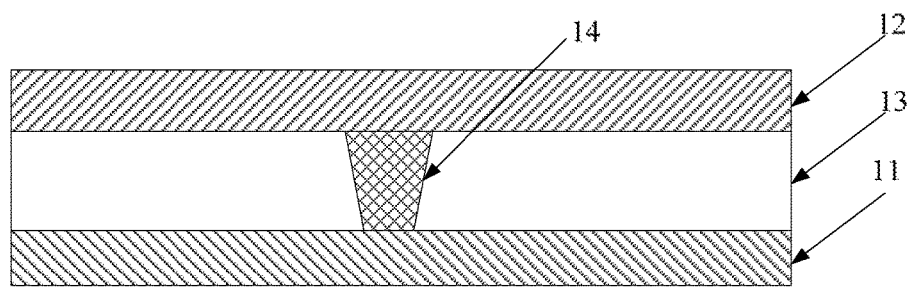
FIG. 2 is a cross section of a first signal wire in an array substrate according to another embodiment of the present disclosure.

FIG. 1 is a top schematic diagram of an array substrate according to an embodiment of the present disclosure. As shown in FIG. 1, the array substrate includes a display region 100 and a frame region 200. The frame region 200 includes a drive circuit region 201 and a wire region 202. In the wire region 202, there are formed a plurality of first signal wires 1 for connecting driving circuits (not shown in FIG. 1) in the drive circuit region 201 with components in the display region 100. FIG. 2 schematically illustrates a cross section of an example of the first signal wire. Referring to FIG. 2, the first signal wire 1 may include a stack of a first conductive layer 11 and a second conductive layer 12, and an insulating layer 13 disposed between the first and the second conductive layers 11 and 12. A first via 14 is formed through the first insulating layer 13, such that the first and the second conductive layers 11 and 12 can be electrically coupled.

Figure 3:
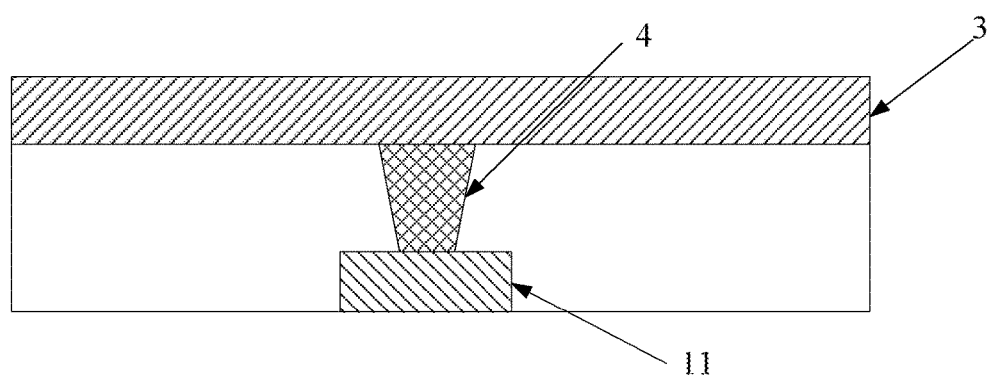
FIG. 3 illustrates how a first signal wire is electrically connected with a third signal wire according to another embodiment of the present disclosure.

Further referring to FIG. 1, in some embodiments, there are multiple connecting wires 3 disposed in the wire region 202. The connecting wires 3 are configured to electrically couple a plurality of gate drive units (not shown in FIG. 1) in the wire region 202 with the first signal wires 1, such that drive signals can be transmitted from the first signal wires 1 to the gate drive units through the connecting wires 3. FIG. 3 schematically illustrates an example of a connection mode between the first signal wire and the connecting wire. As shown in FIG. 3, the connecting wire 3 may be electrically connected with the first conductive layer 11 of the first signal 1 through a second via 4.

As stated above, in some embodiments, the connecting wire 3 may be connected with the first conductive layer 11 of the first signal wire 1, so as to establish electrical connection with the first signal wire. It should be noted that the present disclosure is not limited by such configuration. In some embodiments, the electrical connection may be established by connecting the connecting wire 3 with the second conductive layer 12 of the first signal wire 1.

Also, it should be noted that, in some embodiments, the connecting wires 3 may be coupled with other drive units, so that drive signals can be transmitted to these drive units.

Figure 4:
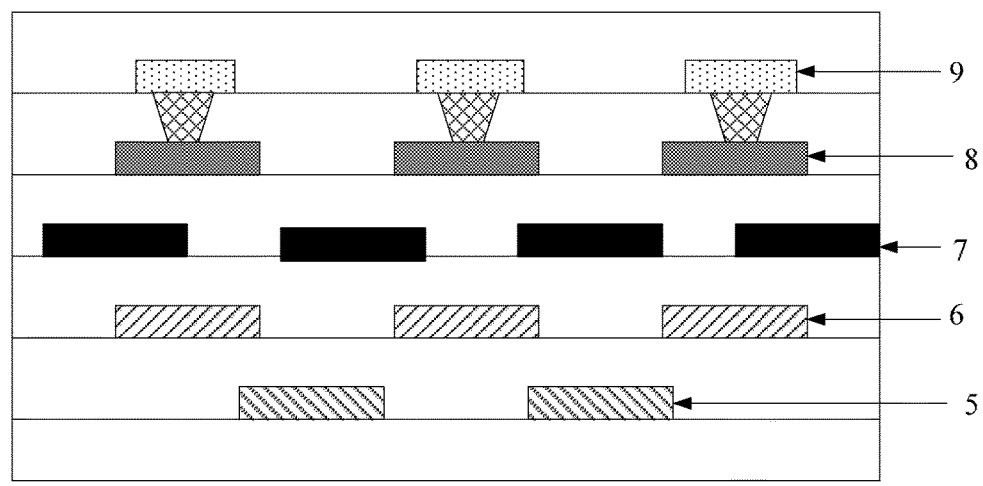
FIG. 4 is a cross section of a display region in an array substrate according to another embodiment of the present disclosure.

FIG. 4 is a cross sectional view of the display region 100 according to disclosed embodiments. The display region 100 includes a gate layer 5 in which gate electrodes are formed, a source/drain layer 6 in which source and drain electrodes are formed, a pixel electrode layer 7 in which pixel electrodes are formed, a common electrode layer 8 in which common electrodes are formed, and a signal transmitting wire layer 9 in which signal transmitting wires are formed. In some embodiments, the common electrode layer 8 may have a plurality of touch units formed therein. The touch units may function as common electrodes in a display period, and also function as touch electrodes in a touch period. Accordingly, the signal transmitting wires in the signal transmitting wire layer 9 are electrically connected with the touch units, so as to transmit common voltage signals to the touch units in the display period, and transmit touch signals to the touch units in the touch period.

Figure 5:
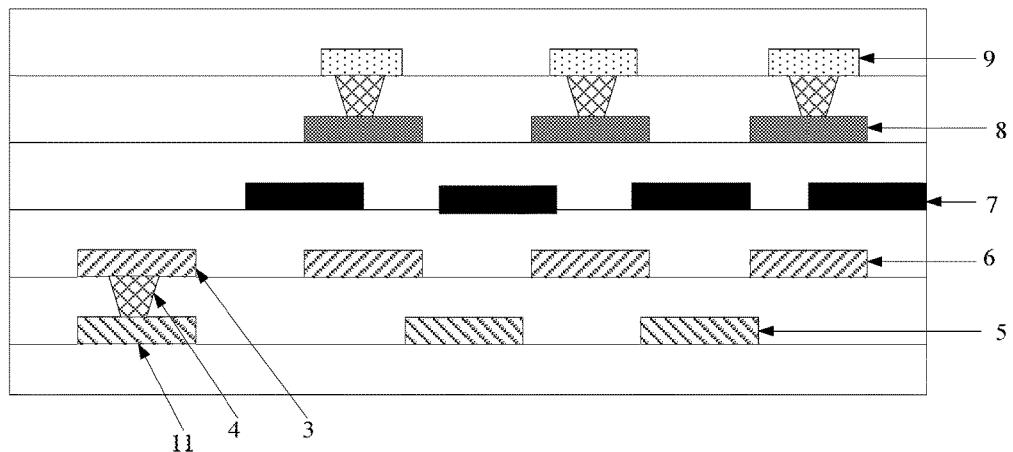
FIGS. 5 to 9 are cross sections of array substrates according to another embodiment of the present disclosure.
Figure 6:
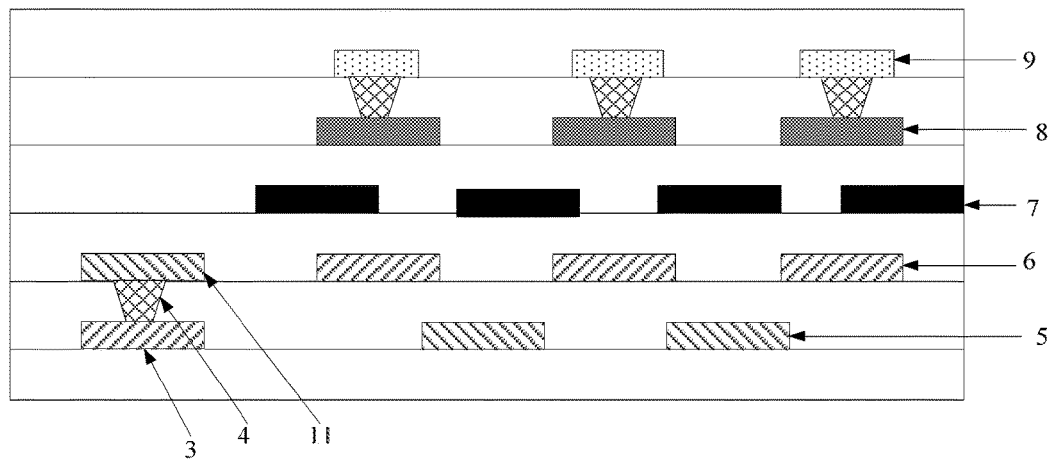

FIG. 5 is a schematic cross-sectional view of the array substrate according to disclosed embodiments. As shown in FIG. 5, in some embodiments, the first conductive layer 11 of the first signal wire 1 in the wire region is disposed on the same layer with the gate layer 5 in the display region, and the connecting wire 3 is disposed on the same layer with the source/drain layer 6. In the present disclosure, layers and/or components being disposed on the same layer refers to that these layers and/or components are disposed at the same or substantially the same height. The height described herein is measured in a direction perpendicular to the array substrate or a display panel including the array substrate. It should be noted that the present disclosure may not be limited by such configuration. In some embodiments, the first conductive layer 11 may be disposed on the same layer with the source/drain layer 6, and the connecting wire 3 may be disposed on the same layer with the gate layer 5.

Figure 7:
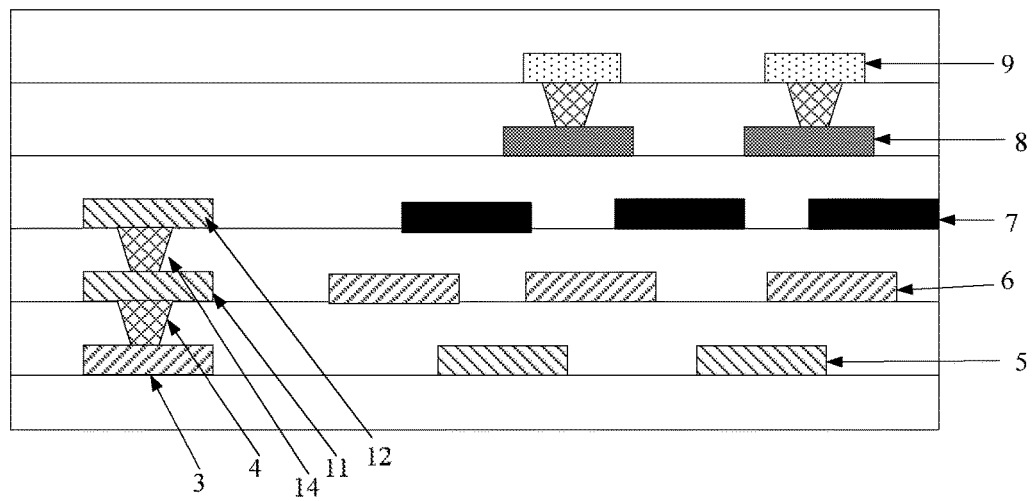
Figure 8:
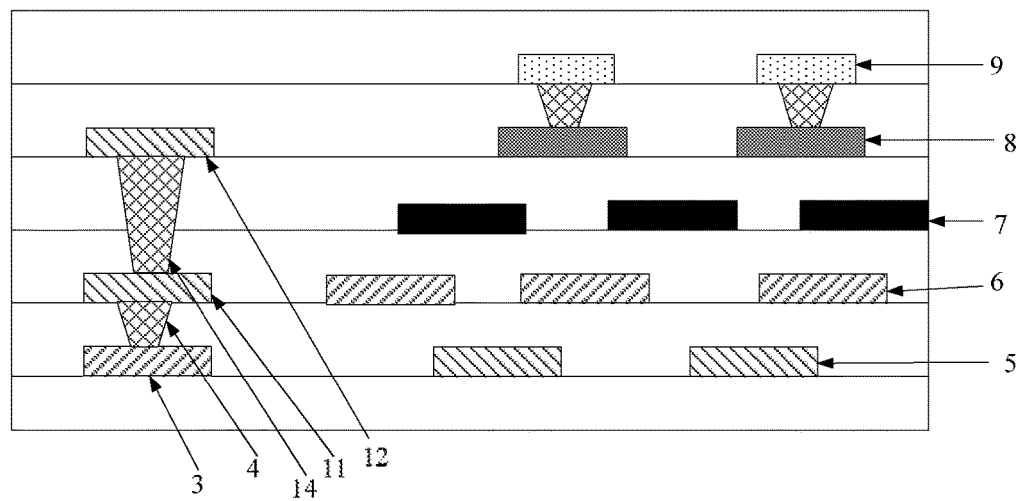
Figure 9:
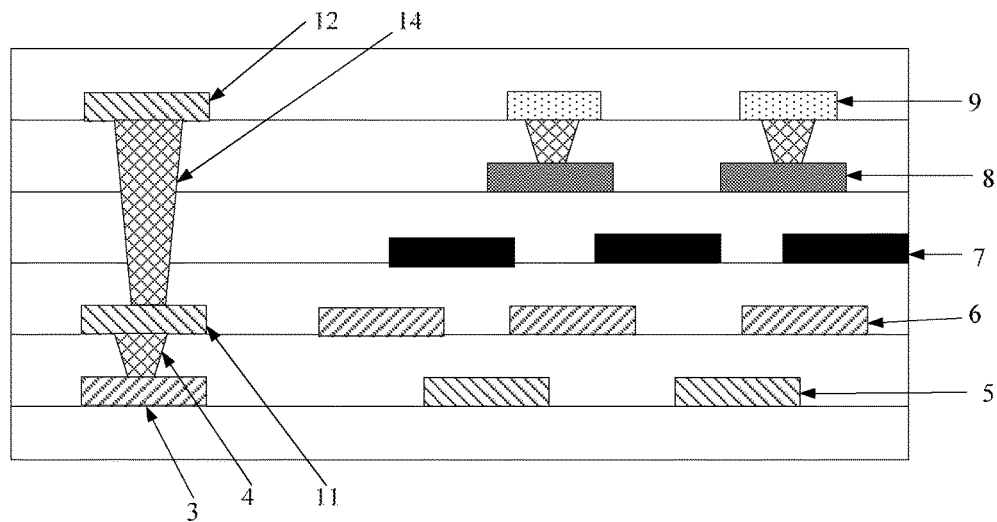

FIGS. 7 to 9 are schematic cross-sectional view of other examples of the array substrate. Specifically, optional positions of the second conductive layer 12 are illustrated. As shown in FIG. 7, in some embodiments, the second conductive layer 12 may be disposed on the same layer with the pixel electrode layer 7. As shown in FIG. 8, in some embodiments, the second conductive layer 12 may be disposed on the same layer with the common electrode layer 8. As shown in FIG. 9, in some embodiments, the second conductive layer 12 may be disposed on the same layer with the signal transmitting wire layer 9.

From the above descriptions, it can be seen that both the first conductive layer 11 and the second conductive layer 12 are disposed on the same layer with two of the layers in the display region. However, the present disclosure is not limited by such configuration. In some embodiments, only one of the first conductive layer 11 and the second conductive layer 12 is disposed on the same layer with one of the layers in the display region 100. In some embodiments, none of the first conductive layer 11 and the second conductive layer 12 is disposed on the same layer with any one layer in the display region 100.

In some embodiments, the second conductive layer 12 is disposed on the same layer with the pixel electrode layer 7, and the pixel electrodes in the pixel electrode layer 7 may be transparent electrodes. In such occasion, the second conductive layer also may be formed as a transparent electrode. As such, the second conductive layer 12 and the pixel electrode layer 7 can be formed in the same process, which means that the whole formation process of the array substrate can be simplified. Therefore, production efficiency may be improved, and cost may be reduced. In some embodiments, the second conductive layer 12 is disposed on the same layer with the signal transmitting wire layer 9, and the signal transmitting wire layer 9 may be formed as a metal wire layer to reduce the resistance thereof. In such occasion, the second conductive layer also may be formed as a metal conductive layer. As such, the second conductive layer 12 and the signal transmitting wire layer 9 can be formed in the same process, which means that the whole formation process of the array substrate can be simplified. Therefore, production efficiency may be improved, and cost may be reduced. Furthermore, using metal material to form the second conductive layer 12 can reduce the resistance thereof, which means that the first signal wire 1 can be formed narrower to obtain the same resistance compared with other material. Accordingly, the frame region of the array substrate can be further reduced. Similarly, in some embodiments, the second conductive layer 12 may be formed on the same layer with the common electrode layer 8, and formed with a material the same as that of the common electrode layer 8.

Figure 10:
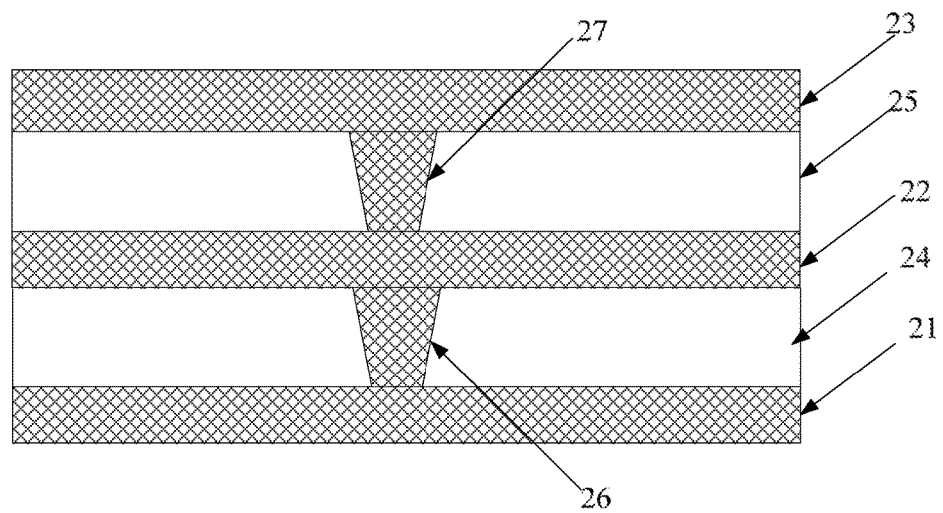
FIG. 10 is a cross section of a second signal wire according to another embodiment of the present disclosure.

Except for the components described above, in some embodiments, referring back to FIG. 1, the wire region 202 further includes a plurality of second signal wires 2. FIG. 10 is a schematic cross-sectional view of an example of the second signal wire according to disclosed embodiments. Referring to FIG. 10, the second signal wire 2 includes a stack of a third conductive layer 21, a fourth conductive layer 22 and a fifth conductive layer 23. A second insulating layer 24 is disposed between the third conductive layer 21 and the fourth conductive layer 22, and a third insulating layer 25 is disposed between the fourth conductive layer 22 and the fifth conductive layer 23. A third via 26 is formed between the third conductive layer 21 and the fourth conductive layer 22, so as to electrically connect the third conductive layer 21 and the fourth conductive layer 22. A fourth via 27 is formed between the fourth conductive layer 22 and the fifth conductive layer 23, so as to electrically connect the fourth conductive layer 22 and the fifth conductive layer 23.

It should be noted that there are various options for specific positions of the third conductive layer 21, the fourth conductive layer 22 and the fifth conductive layer 23. In some embodiments, any one of the third conductive layer 21, the fourth conductive layer 22 and the fifth conductive layer 23 may be disposed not on the same layer with any one of the gate layer 5, the source/drain layer 6, the pixel electrode layer 7, the common electrode layer 8 and the signal transmitting wire layer 9. In some embodiments, any one of the third conductive layer 21, the fourth conductive layer 22 and the fifth conductive layer 23 may be disposed on the same layer with any one of the gate layer 5, the source/drain layer 6, the pixel electrode layer 7, the common electrode layer 8 and the signal transmitting wire layer 9. As long as the third conductive layer 21, the fourth conductive layer 22 and the fifth conductive layer 23 are not all set on the same layer, and they are electrically connected with each other, the width of the wire region can be reduced under the circumstance that the resistance value remains. Therefore, the area of the frame region of the array substrate can be reduced.

Figure 11:
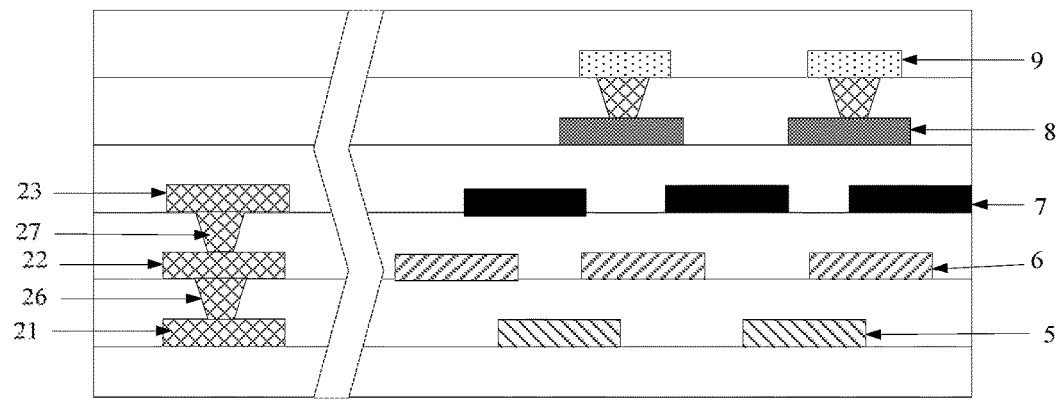
FIGS. 11 to 20 are cross sections of array substrates according to another embodiment of the present disclosure.

FIGS. 11 to 20 are schematic across-sectional views of array substrates according to disclosed embodiments. As shown in FIG. 11, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the pixel electrode layer 7.

Figure 12:
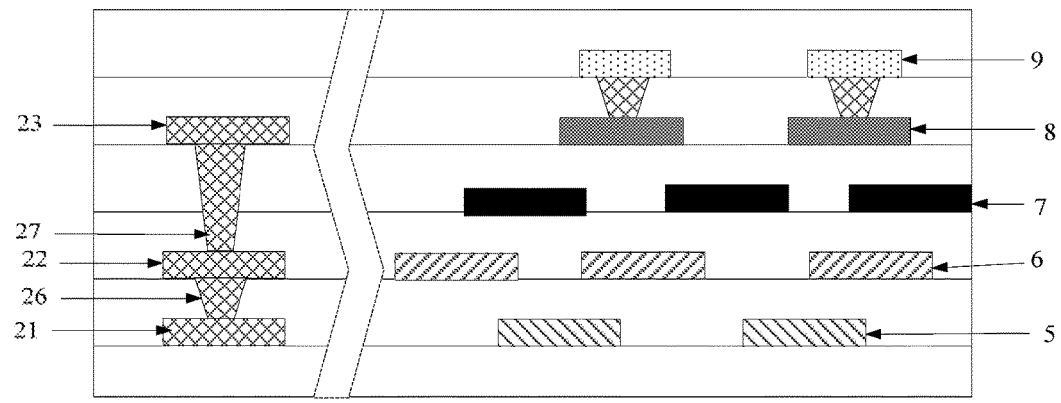

As shown in FIG. 12, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the common electrode layer 8.

Figure 13:
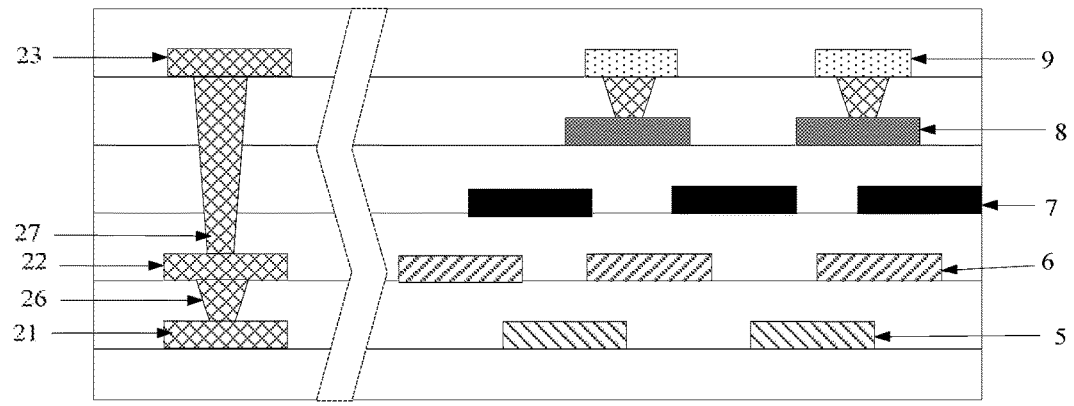

As shown in FIG. 13, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the signal transmitting wire layer 9.

Figure 14:
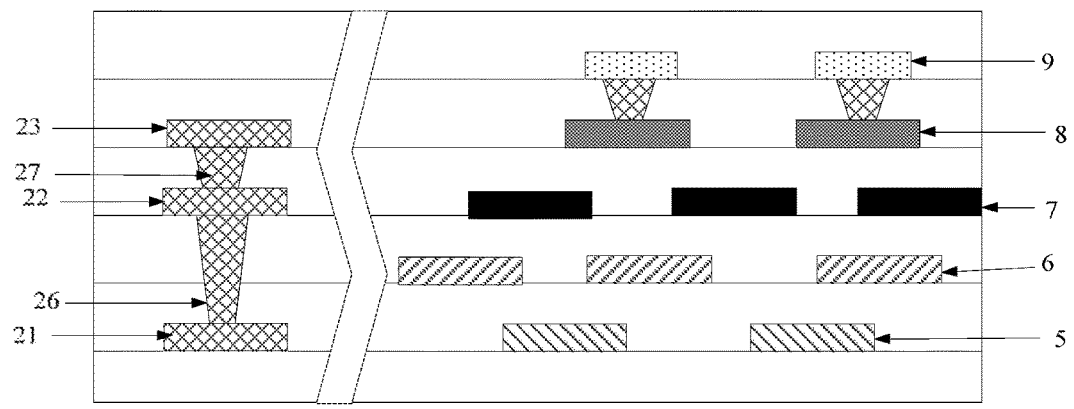

As shown in FIG. 14, in some embodiments, the third conductive layer 21 is disposed on the same layer with the gate layer 5; the fourth conductive layer 22 is disposed on the pixel electrode layer 7; and the fifth conductive layer 23 is disposed on the same layer with the common electrode layer 8.

Figure 15:
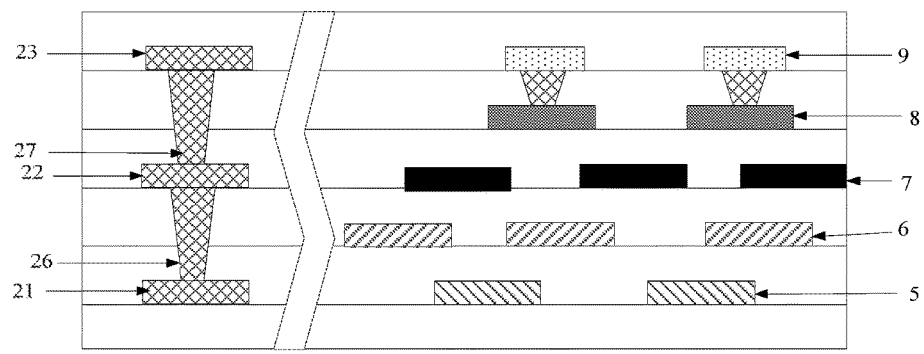

As shown in FIG. 15, in some embodiments, the third conductive layer 21 is disposed on the same layer with the gate layer 5; the fourth conductive layer 22 is disposed on the pixel electrode layer 7; and the fifth conductive layer 23 is disposed on the same layer with the signal transmitting wire layer 9.

Figure 16:
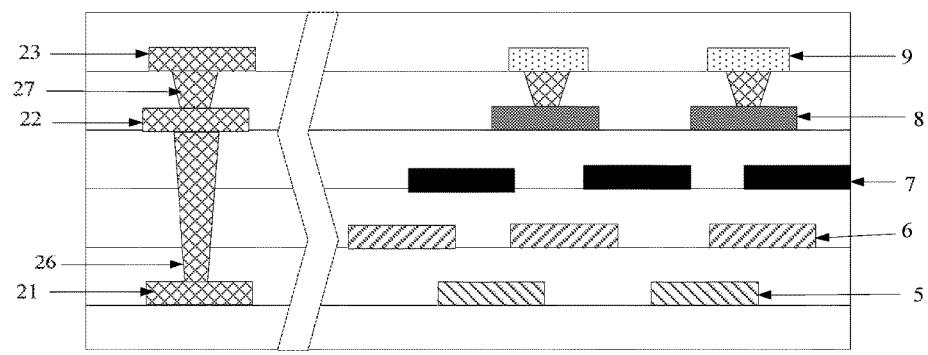

As shown in FIG. 16, in some embodiments, the third conductive layer 21 is disposed on the same layer with the gate layer 5; the fourth conductive layer 22 is disposed on the common electrode layer 8; and the fifth conductive layer 23 is disposed on the same layer with the signal transmitting wire layer 9.

Figure 17:
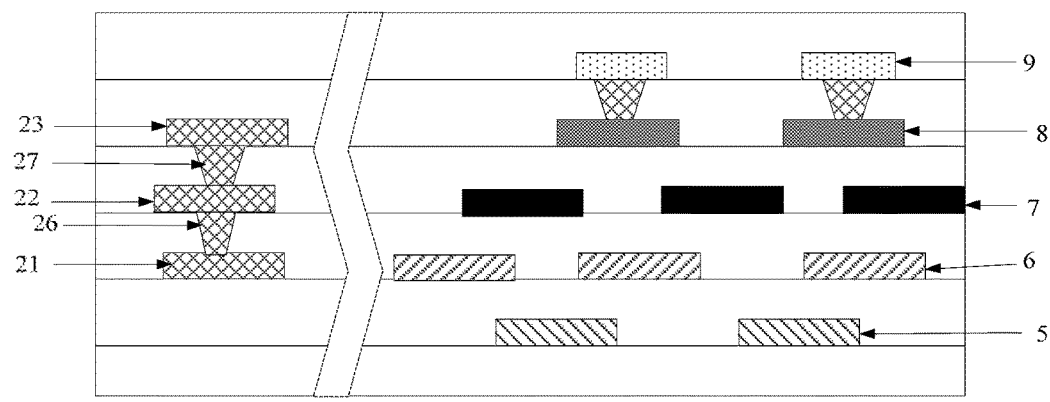

As shown in FIG. 17, in some embodiments, the third conductive layer 21 is disposed on the source/drain layer 6; the fourth conductive layer 22 is disposed on the pixel electrode layer 7; and the fifth conductive layer 23 is disposed on the same layer with the common electrode layer 8.

Figure 18:
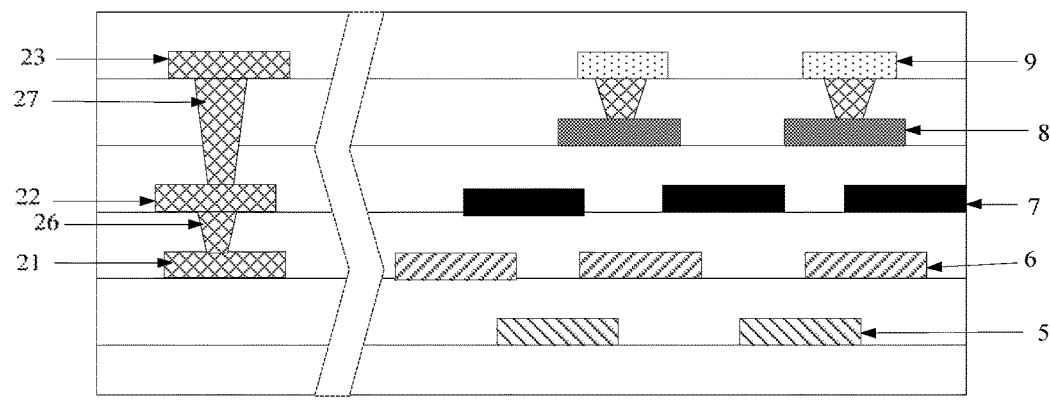

As shown in FIG. 18, in some embodiments, the third conductive layer 21 is disposed on the source/drain layer 6; the fourth conductive layer 22 is disposed on the pixel electrode layer 7; and the fifth conductive layer 23 is disposed on the same layer with the signal transmitting wire layer 9.

Figure 19:
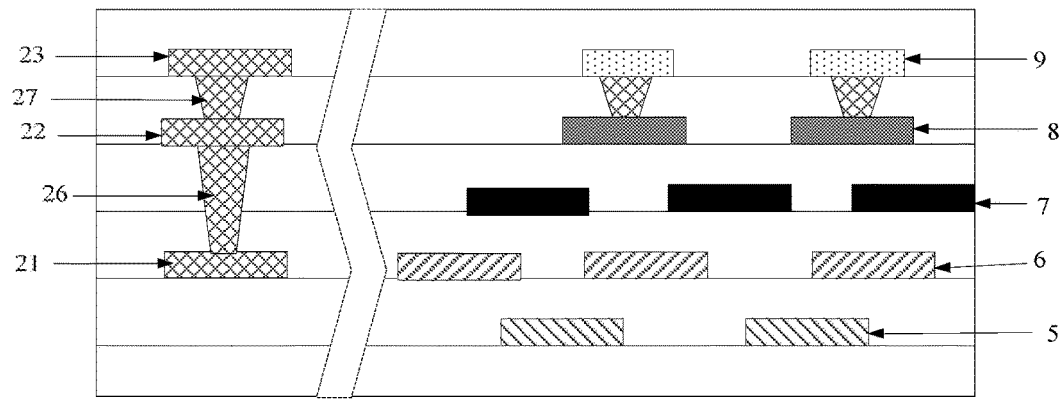

As shown in FIG. 19, in some embodiments, the third conductive layer 21 is disposed on the source/drain layer 6; the fourth conductive layer 22 is disposed on the common electrode layer 8; and the fifth conductive layer 23 is disposed on the same layer with the signal transmitting wire layer 9.

Figure 20:
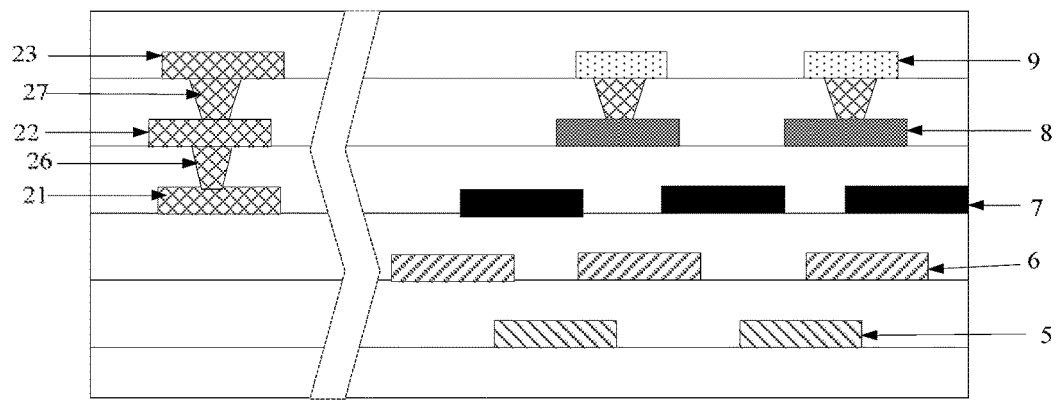

As shown in FIG. 20, in some embodiments, the third conductive layer 21 is disposed on the pixel electrode layer 7; the fourth conductive layer 22 is disposed on the common electrode layer 8; and the fifth conductive layer 23 is disposed on the same layer with the signal transmitting wire layer 9.

It should be noted that the present disclosure is not limited by above embodiments. Specific positions of the pixel electrode layer 7, the common electrode 8 and the signal transmitting wire layer 9 may vary according to practical requirements.

Figure 21:
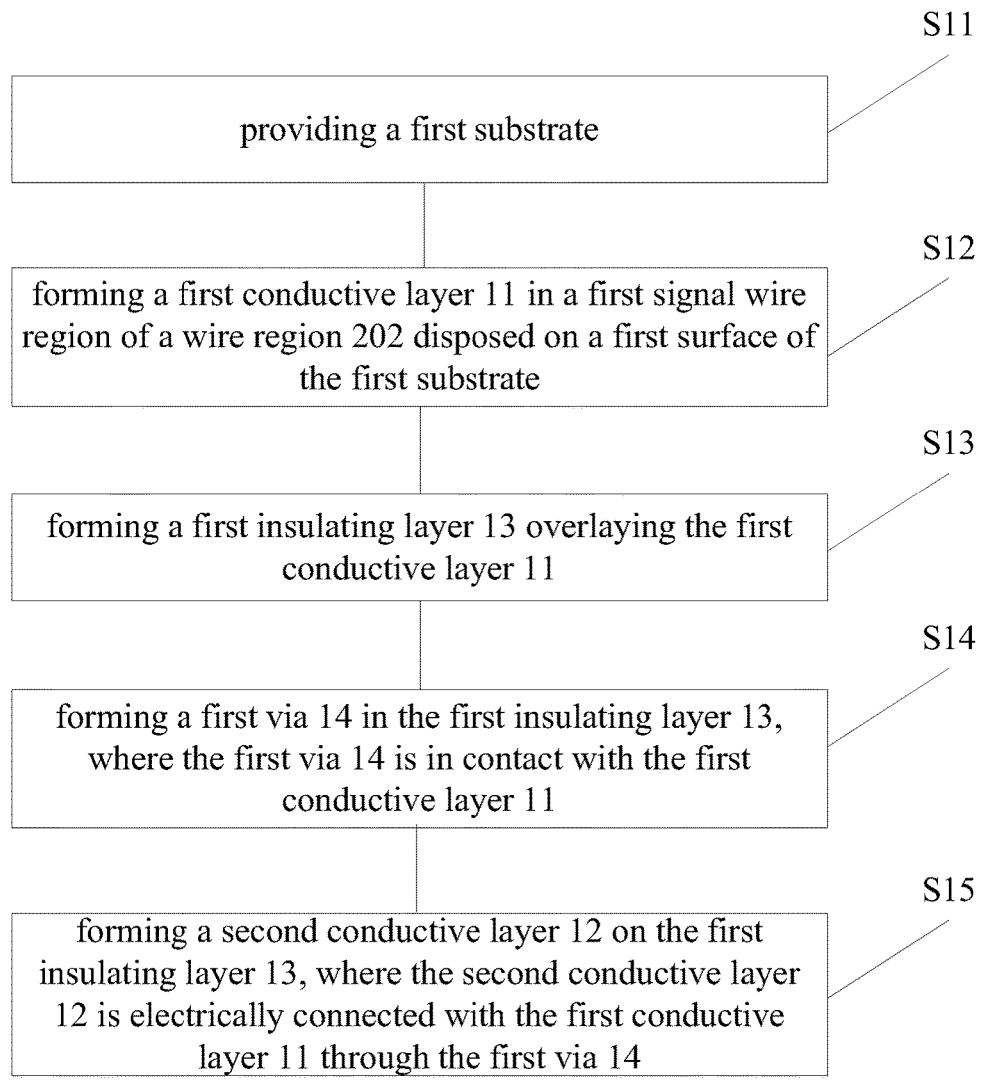
FIG. 21 is a flow chart of a process for forming an array substrate according to another embodiment of the present disclosure.

Accordingly, a method for forming an array substrate is provided. FIG. 21 schematically illustrates a flow chart of the process for forming the array substrate, which includes:

S11: providing a first substrate;

S12: forming a first conductive layer 11 in a first signal wire region of a wire region 202 disposed on a first surface of the first substrate;

S13: forming a first insulating layer 13 overlaying the first conductive layer 11;

S14: forming a first via 14 in the first insulating layer 13, where the first via 14 is in contact with the first conductive layer 11; and S15: forming a second conductive layer 12 on the first insulating layer 13, where the second conductive layer 12 is electrically connected with the first conductive layer 11 through the first via 14.

Specifically, in some embodiments, the method includes: providing the first substrate; forming a conductive layer on the first surface of the first substrate and etching the conductive layer to forming the first conductive layer 11 in the first signal wire region of the wire region disposed on the first surface of the first substrate; forming the first insulating layer 13 on the first conductive layer 11 to completely overlay the first conductive layer 11; etching the first insulating layer 13 to form a through via partially exposing the first conductive layer 11, and forming the first via 14 in the through via, such that the first via 14 is in contact with the first conductive layer 11; and forming a conductive layer on the first insulating layer 13, and etching the conductive layer to form the second conductive layer 12 in the first signal wire region, such that the second conductive layer 12 is electrically connected with the first conductive layer 11 through the first via 14.

In some embodiments, the method may further include: forming, in the wire region disposed on the first surface of the first substrate, a plurality of gate drive units and a plurality of connecting wires 3 electrically connected with the gate drive units. Each of the connecting wires 3 is electrically connected with one of the first signal wires 1 through a second via 4, such that drive signals can be transmitted from the first signal wires 1 to the gate drive units.

In some embodiments, the connecting wire 3 and the second conductive layer 12 may be formed on opposite sides of the first conductive layer 11, such that the connecting wire 3 can be electrically connected with the first conductive layer 11, i.e., electrical connection between the connecting wire 3 and the first signal wire 1 can be established. In some embodiments, the connecting wire 3 and the first conductive layer 11 may be formed on opposite sides of the second conductive layer 12, such that the connecting wire 3 can be electrically connected with the second conductive layer 12, i.e., electrical connection between the connecting wire 3 and the first signal wire 1 can be established. In some embodiments, the connecting wire 3 may be formed between the first conductive layer 11 and the second conductive layer 12, such that the connecting wire 3 can be electrically connected with both the first conductive layer 11 and the second conductive layer 12, i.e., electrical connection between the connecting wire 3 and the first signal wire 1 can be established.

It should be noted that, in some embodiment, the connecting wire 3 may be used for providing drive signals to other drive units.

In some embodiments, the method may further include: forming, in the display region disposed on the first surface of the first substrate, a gate layer 5, a source/drain layer 6, a pixel electrode layer 7, a common electrode layer 8 and a signal transmitting wire layer 9. In some embodiments, the common electrode layer 8 may have a plurality of touch units formed therein. The touch units may function as common electrodes in a display period, and also function as touch electrodes in a touch period. Accordingly, signal transmitting wires formed in the signal transmitting wire layer 9 are electrically connected with the touch units, so as to transmit common voltage signals to the touch units in the display period, and transmit touch signals to the touch units in the touch period.

In some embodiments, the first conductive layer 11 and the gate layer 5 may be formed in the same process, and the connecting wire 3 and the source/drain layer 6 may be formed in the same process, such that the whole formation process of the array substrate can be simplified. Therefore, production efficiency may be improved, and cost may be reduced. In some embodiments, the first conductive layer 11 and the source/drain layer 6 may be formed in the same process, and the connecting wire 3 and the gate layer 5 may be formed in the same process, such that the whole formation process of the array substrate can be simplified. Therefore, production efficiency may be improved, and cost may be reduced. In some embodiments, the first conductive layer 11 and the connecting wire 3 may be formed in individual processes without being formed with any other component.

As for the second conductive layer 12, it may be formed in an individual process, or in the same process with the pixel electrode layer 7, the common electrode layer 8 or the signal transmitting wire layer 9, such that the whole formation process of the array substrate can be simplified. Therefore, production efficiency may be improved, and cost may be reduced.

Figure 22:
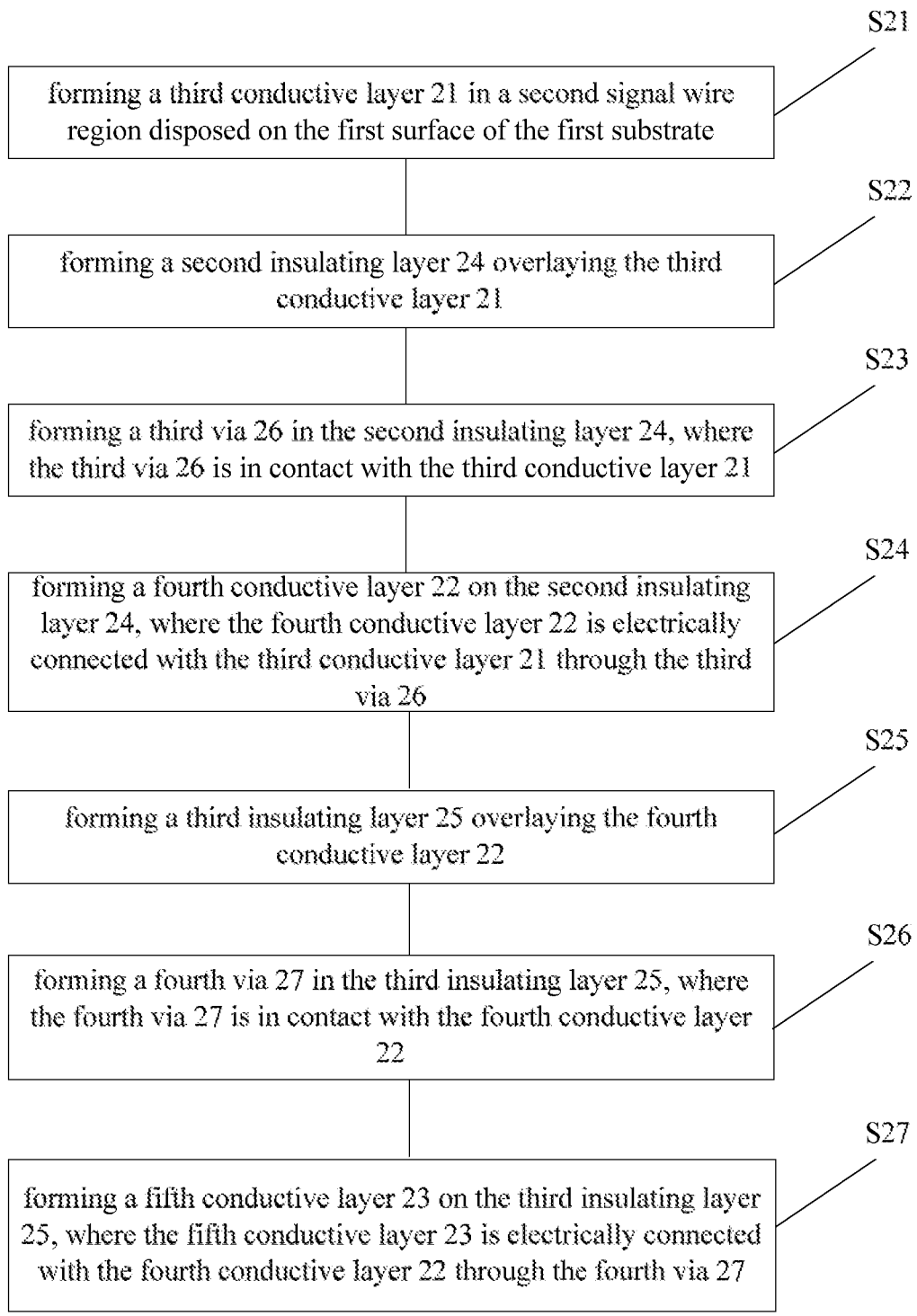
FIG. 22 is a flow chart of another process for forming an array substrate according to another embodiment of the present disclosure.

In some embodiments, the method may further include some steps as illustrated in FIG. 22, which are described hereinafter.

S21: forming a third conductive layer 21 in a second signal wire region disposed on the first surface of the first substrate;

S22: forming a second insulating layer 24 overlaying the third conductive layer 21;

S23: forming a third via 26 in the second insulating layer 24, where the third via 26 is in contact with the third conductive layer 21;

S24: forming a fourth conductive layer 22 on the second insulating layer 24, where the fourth conductive layer 22 is electrically connected with the third conductive layer 21 through the third via 26;

S25: forming a third insulating layer 25 overlaying the fourth conductive layer 22;

S26: forming a fourth via 27 in the third insulating layer 25, where the fourth via 27 is in contact with the fourth conductive layer 22; and S27: forming a fifth conductive layer 23 on the third insulating layer 25, where the fifth conductive layer 23 is electrically connected with the fourth conductive layer 22 through the fourth via 27.

Specifically, in some embodiments, the method includes:

forming a conductive layer on the first surface of the first substrate and etching the conductive layer to forming the first conductive layer 11 in the first signal wire region and the third conductive layer 21 in the second signal wire region disposed on the first surface of the first substrate;

forming the first insulating layer 13 on the first conductive layer 11 to completely overlay the first conductive layer 11 and the third conductive layer 21;

etching the first insulating layer 13 to form through vias partially exposing the first conductive layer 11 and the third conductive layer 21, and forming the first via 14 and the third via 26 in the through vias, such that the first via 14 is in contact with the first conductive layer 11, and the third via 26 is in contact with the third conductive layer 21;

forming a conductive layer on the first insulating layer 13, and etching the conductive layer to form the second conductive layer 12 in the first signal wire region and the fourth conductive layer 22 in the second signal wire region, such that the second conductive layer 12 is electrically connected with the first conductive layer 11 through the first via 14, and the fourth conductive layer 22 is electrically connected with the third conductive layer 21 through the third via 26;

forming the third insulating layer 25 overlaying the second conductive layer 12 and the fourth conductive layer 22;

etching the third insulating layer 25 to form through holes partially exposing the second conductive layer 12 and the fourth conductive layer 22, and forming the second via 4 and the fourth via 27 in the through holes, such that the second via 4 is in contact with the second conductive layer 12, and the fourth via 27 is in contact with the fourth conductive layer 22; and forming a conductive layer on the third insulating layer 25, and etching the conductive layer to form the connecting wires 3 in the first signal wire region and the fifth conductive layer 23 in the second signal wire region, such that the connecting wires 3 are electrically connected with the second conductive layer 12 through the second via 4, and the fifth conductive layer 23 is electrically connected with the fourth conductive layer 22 through the fourth via 27.

In some embodiments, the first conductive layer 11 and the third conductive layer 21 may be formed in the same process. In some embodiments, the second conductive layer 12 and the fifth conductive layer 23 may be formed in the same process. In some embodiments, the connecting wires 3 and the fourth conductive layer 22 may be formed in the same process. In some embodiments, the first conductive layer 11, the second conductive layer 12, the third conductive layer 21, the fourth conductive layer 22, the fifth conductive layer 23 and the connecting wires 3 are respectively formed in individual processes without being formed with any other component.

In some embodiments, any one of the third conductive layer 21, the fourth conductive layer 22 and the fifth conductive layer 23 may be in the same process with any one of the gate layer 5, the source/drain layer 6, the pixel electrode layer 7, the common electrode layer 8 and the signal transmitting wire layer 9. As long as the third conductive layer 21, the fourth conductive layer 22 and the fifth conductive layer 23 are not all set on the same layer, and they are electrically connected with each other, the width of the first signal wire 1 and the second signal 2 can be reduced under the circumstance that the resistance value remains. Therefore, the area of the frame region of the array substrate can be reduced.

In conclusion, in the array substrate provided in the present disclosure, the wire region includes a plurality of first signal wires 1 each of which has two electrically coupled conductive layers 11 and 12. That means, to obtain the same resistance value as that in prior art, the first signal wires 1 in the present disclosure can be formed with a reduced width. Therefore, if the quantity of the wires remains the same, the area of the wire region 202 in the array substrate may be smaller due to the reduced width, thereby reducing the area of the frame region of a display panel including such an array substrate.

Figure 23:
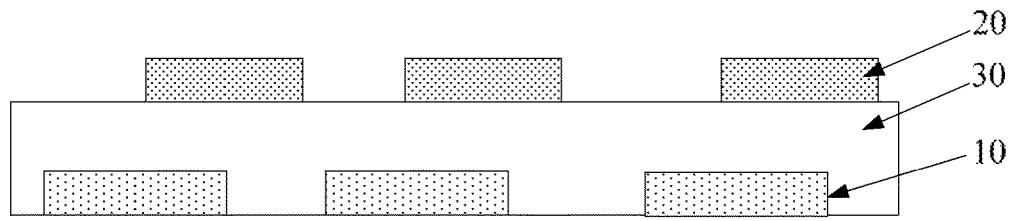
FIGS. 23 to 26 are cross sections of wire regions in array substrates according to another embodiment of the present disclosure.

Furthermore, another array substrate is provided according to disclosed embodiments. The array substrate may also include components as illustrated in FIG. 1, i.e., the array substrate also includes a display region 100 and a frame region 200. The frame region 200 includes a drive circuit region 201 and a wire region 202. In the wire region 202, there are formed a plurality of wires for connecting components in the drive circuit region 201 with components in the display region 100. The array substrate further includes some components as illustrated in FIG. 23. In the wire region 202, there are formed a first signal wire layer 10 stacked with a second signal wire layer 20. There is a first insulating layer 30 disposed between the first and the second signal wire layers 10 and 20. The first signal wire layer 10 includes a plurality of first signal wires extending along a first direction, and the second signal wire layer 20 includes a plurality of second signal wires extending along the first direction. Furthermore, at least one of the first signals wires and one of the second signal wires are at least partially overlapped in a direction perpendicular to the array substrate. In such configuration, the first and the second signal wires, which are conventionally disposed on the same layer, are disposed in different layers which are stacked with each other. Therefore, to arrange the wires with the same quantity as in the prior art, the wires required to be formed in each of the layers in this embodiment can be reduced. As such, the wire region of the array substrate can have a smaller size, and thus the whole frame region of a display panel including such an array substrate can also be smaller. It should be noted that, in some embodiments, the first direction may extend along a length direction of the frame region.

Further referring to FIG. 1, in some embodiments, there are multiple gate drive units (not shown in FIG. 1) and multiple connecting wires 3 disposed in the wire region 202. The connecting wires 3 are configured to provide drive signals 1 to the gate drive units.

In some embodiments, signals transmitted through the first signal wire and the second signal wires may be different. In some embodiments, signals transmitted through the first signal wire and the second signal wires may be the same.

In some embodiments, the connecting wires 3 may be connected with the first signal wires in the first signal wire layer 10. In some embodiments, the connecting wires 3 may be connected with the second signal wires in the second signal wire layer 20. In some embodiments, some of the connecting wires 3 may be connected with the first signal wires in the first signal wire layer 10, some of the connecting wires 3 may be connected with the second signal wires in the second signal wire layer 20.

In some embodiments, the display region 100 includes a gate layer 5 in which gate electrodes are formed, a source/drain layer 6 in which source and drain electrodes are formed, a pixel electrode layer 7 in which pixel electrodes are formed, a common electrode layer 8 in which common electrodes are formed, and a signal transmitting wire layer 9 in which signal transmitting wires are formed. In some embodiments, the common electrode layer 8 may have a plurality of touch units formed therein. The touch units may function as common electrodes in a display period, and also function as touch electrodes in a touch period. Accordingly, the signal transmitting wires in the signal transmitting wire layer 9 are electrically connected with the touch units, so as to transmit common voltage signals to the touch units in the display period, and transmit touch signals to the touch units in the touch period.

In some embodiments, any one of the first signal wire layer 10 and the second signal wire layer 20 may be disposed not on the same layer with any one of the gate layer 5, the source/drain layer 6, the pixel electrode layer 7, the common electrode layer 8 and the signal transmitting wire layer 9. In some embodiments, any one of the first signal wire layer 10 and the second signal wire layer 20 may be disposed on the same layer with any one of the gate layer 5, the source/drain layer 6, the pixel electrode layer 7, the common electrode layer 8 and the signal transmitting wire layer 9. The present disclosure is not limited by specific positions of the above layers, as long as the first signal wire layer 10 and the second signal wire layer 20 are not set on the same layer, and they are electrically insulated with each other.

Figure 24:
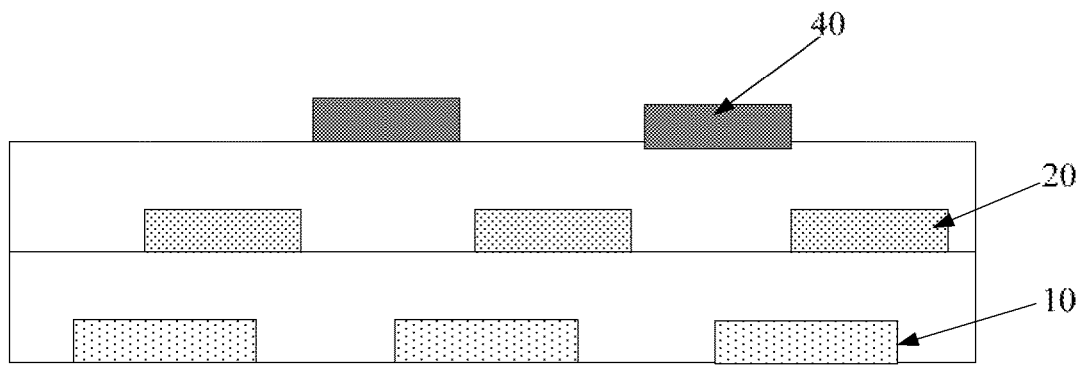

In some embodiments, as shown in FIG. 24, the wire region 202 further includes a third signal wire layer 40 which is electrically insulated from both the first signal wire layer 10 and the second signal wire layer 20. The third signal wire layer 40 includes a plurality of third signal wires extending along the first direction. The third signal wire layer may also at least partially overlap with any one of the first signal wire layer 10 and the second signal wire layer 20 in the direction perpendicular to the array substrate. Therefore, to arrange the wires with the same quantity as in the prior art, the wires required to be formed in each of the layers in this embodiment can be reduced. As such, the wire region of the array substrate can have a smaller size, and thus the whole frame region of a display panel including such an array substrate can also be smaller.

It should be noted that the signal wires in the first, the second and the third signal wire layers may be the same, or different, or partially the same, which is not limited in the present disclosure.

Figure 25:
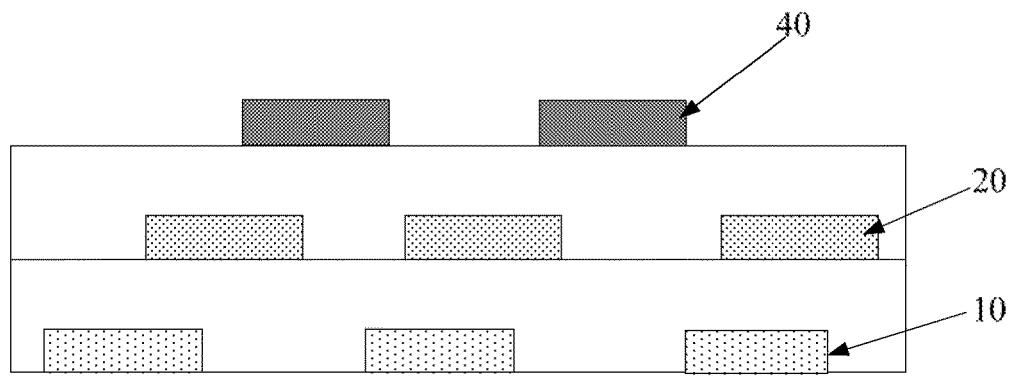
Figure 26:
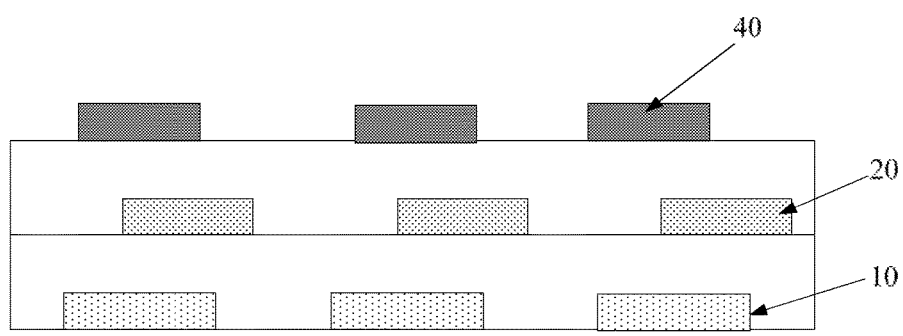

FIG. 24 schematically illustrates one embodiment in which the third signal wires partially overlap the first signal wires in the direction perpendicular to the array substrate. FIG. 25 schematically illustrates one embodiment in which the third signal wires partially overlap the second signal wires in the direction perpendicular to the array substrate. FIG. 26 schematically illustrates one embodiment in which the third signal wires partially overlap both the first signal wires and the second signal wires in the direction perpendicular to the array substrate.

In some embodiments, the third signal wire layer 40 may be disposed not on the same layer with any one of the gate layer 5, the source/drain layer 6, the pixel electrode layer 7, the common electrode layer 8 and the signal transmitting wire layer 9. In some embodiments, the third signal wire layer 40 may be disposed on the same layer with any one of the gate layer 5, the source/drain layer 6, the pixel electrode layer 7, the common electrode layer 8 and the signal transmitting wire layer 9. As such, the thickness of the array substrate may be reduced.

Figure 27:
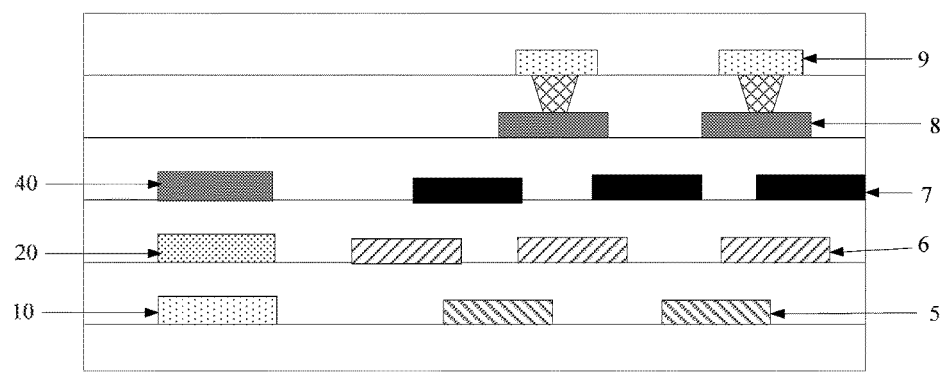
FIGS. 27 to 36 are cross sections of array substrates according to another embodiment of the present disclosure.

FIGS. 27 to 36 schematically illustrate how to dispose the signal wire layers according to disclosed embodiments. As shown in FIG. 27, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the pixel electrode layer 7.

Figure 28:
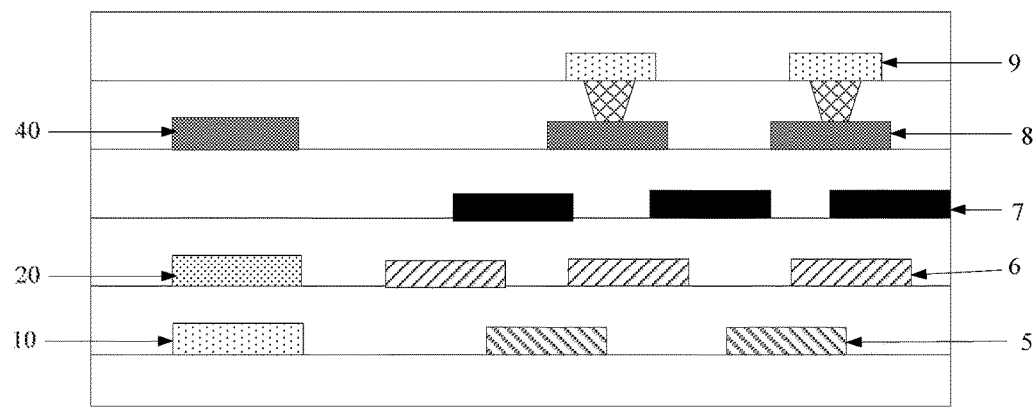

As shown in FIG. 28, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the common electrode layer 8.

Figure 29:
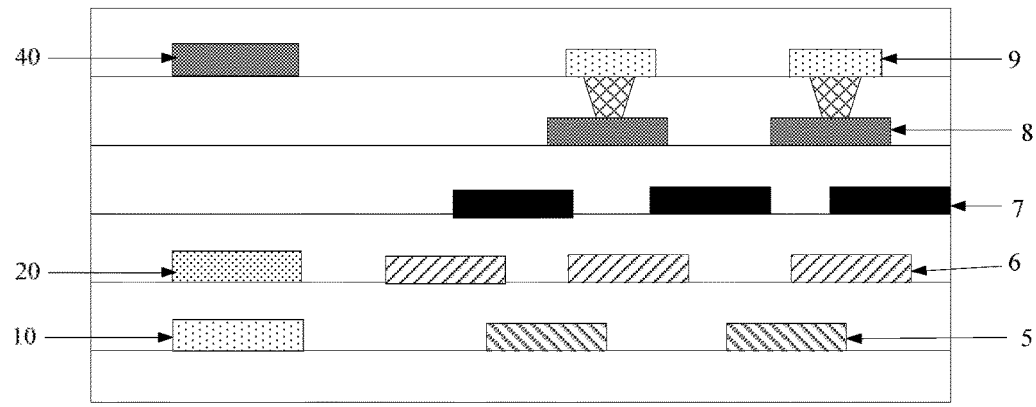

As shown in FIG. 29, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the signal transmitting wire layer 9.

Figure 30:
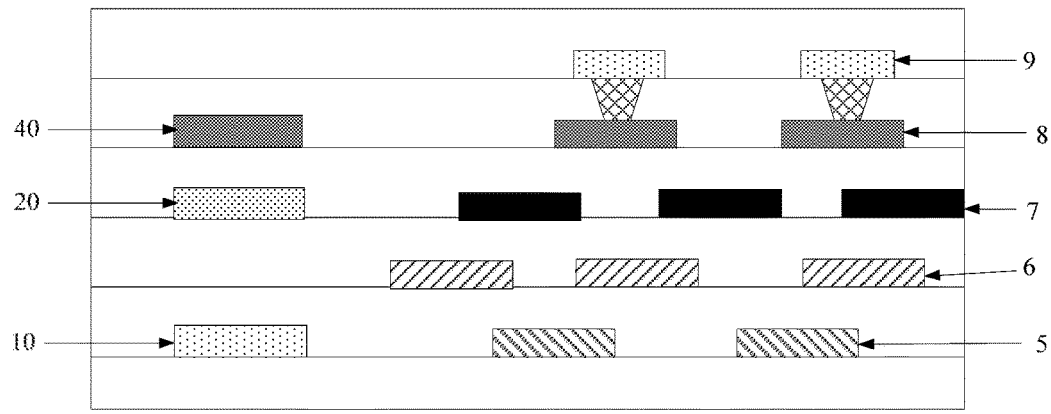

As shown in FIG. 30, in some embodiments, the first signal wire layer 10 is disposed on the same layer with the gate layer 5; the second signal wire layer 20 is disposed on the pixel electrode layer 7; and the third signal wire layer 40 is disposed on the same layer with the common electrode layer 8.

Figure 31:
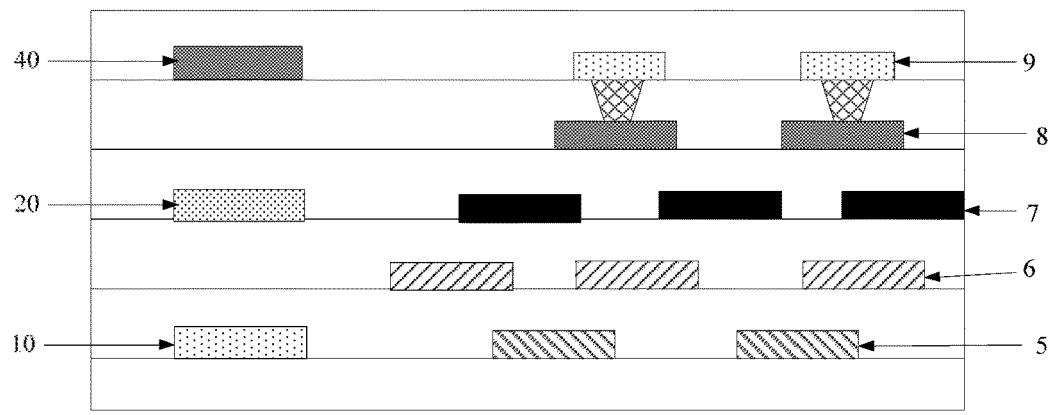

As shown in FIG. 31, in some embodiments, the first signal wire layer 10 is disposed on the same layer with the gate layer 5; the second signal wire layer 20 is disposed on the pixel electrode layer 7; and the third signal wire layer 40 is disposed on the same layer with the signal transmitting wire layer 9.

Figure 32:
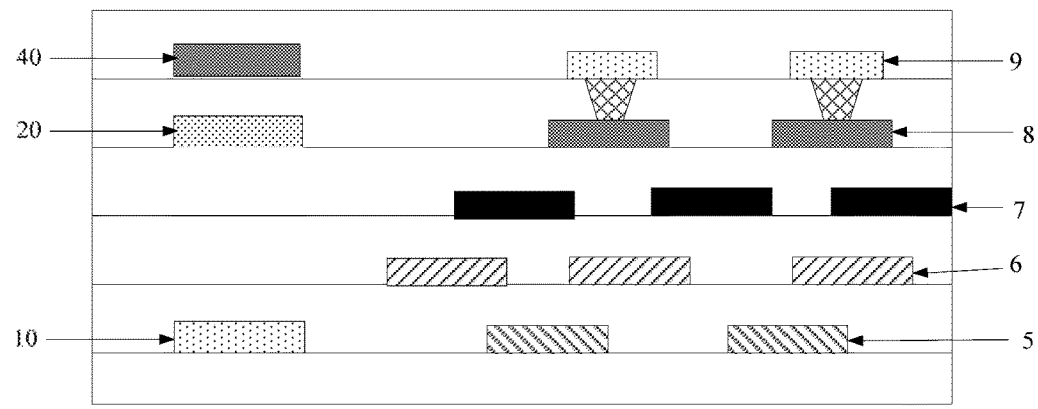

As shown in FIG. 32, in some embodiments, the first signal wire layer 10 is disposed on the same layer with the gate layer 5; the second signal wire layer 20 is disposed on the common electrode layer 8; and the third signal wire layer 40 is disposed on the same layer with the signal transmitting wire layer 9.

Figure 33:
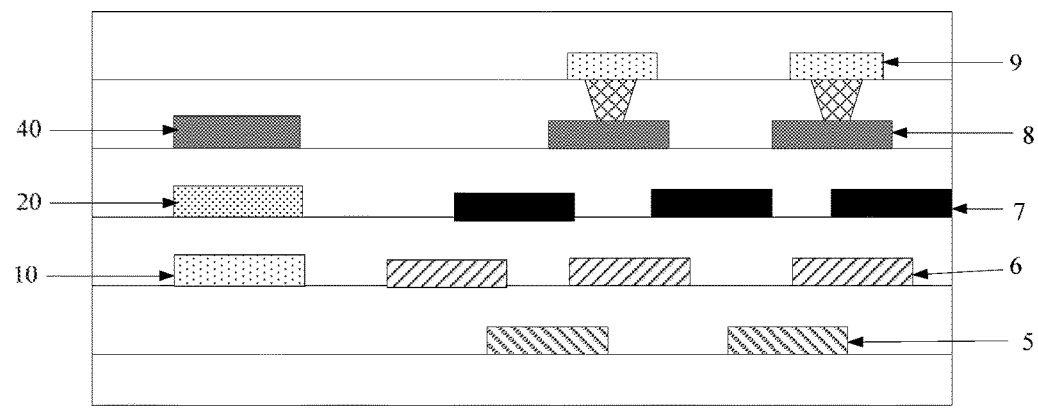

As shown in FIG. 33, in some embodiments, the first signal wire layer 10 is disposed on the source/drain layer 6; the second signal wire layer 20 is disposed on the pixel electrode layer 7; and the third signal wire layer 40 is disposed on the same layer with the common electrode layer 8.

Figure 34:
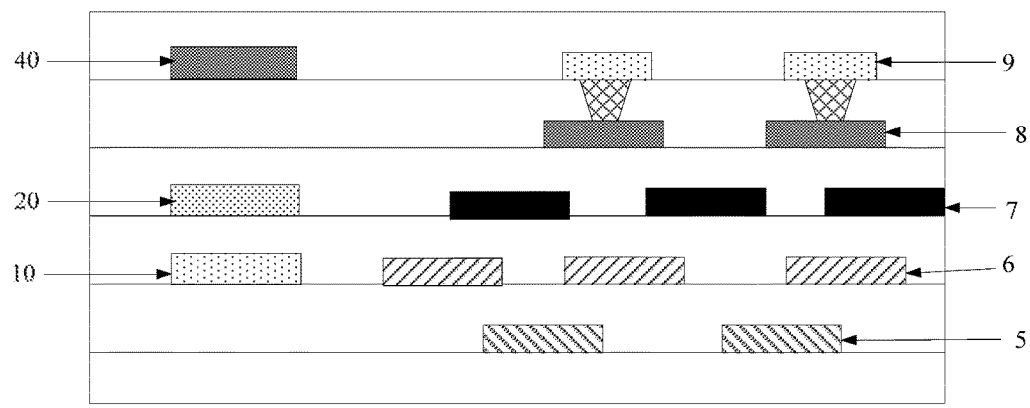

As shown in FIG. 34, in some embodiments, the first signal wire layer 10 is disposed on the source/drain layer 6; the second signal wire layer 20 is disposed on the pixel electrode layer 7; and the third signal wire layer 40 is disposed on the same layer with the signal transmitting wire layer 9.

Figure 35:
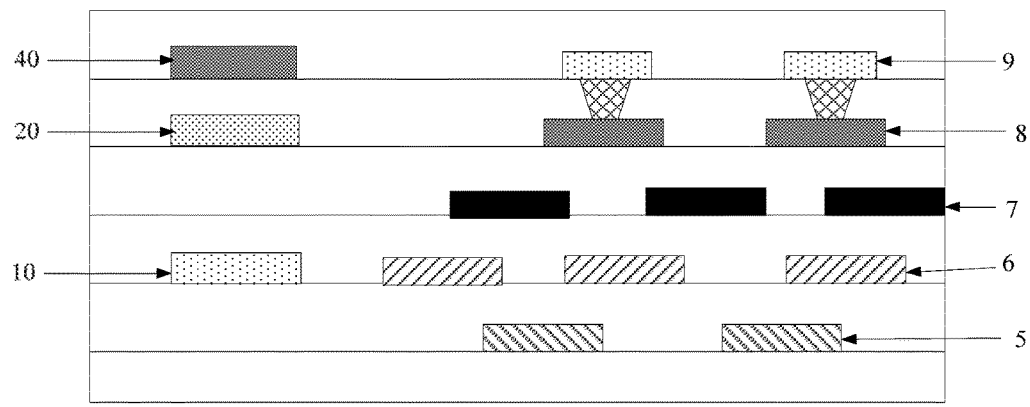

As shown in FIG. 35, in some embodiments, the first signal wire layer 10 is disposed on the source/drain layer 6; the second signal wire layer 20 is disposed on the common electrode layer 8; and the third signal wire layer 40 is disposed on the same layer with the signal transmitting wire layer 9.

Figure 36:
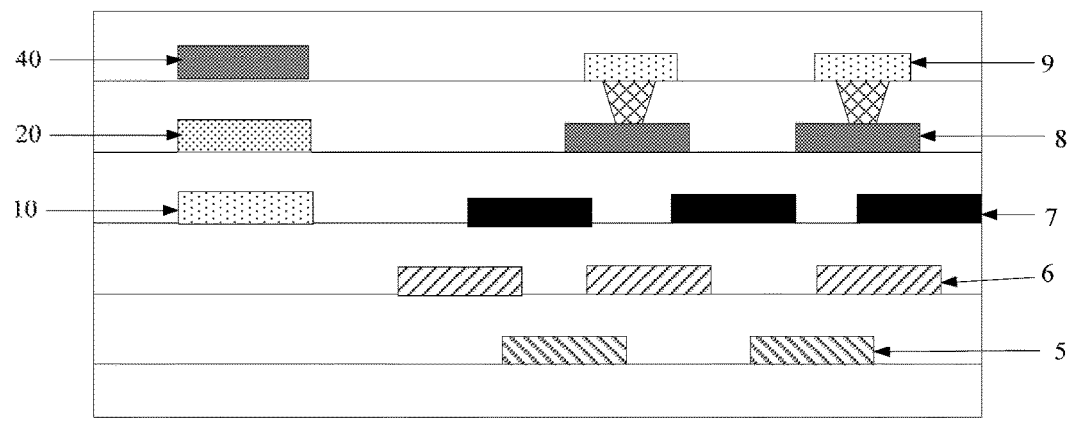

As shown in FIG. 36, in some embodiments, the first signal wire layer 10 is disposed on the pixel electrode layer 7; the second signal wire layer 20 is disposed on the common electrode layer 8; and the third signal wire layer 40 is disposed on the same layer with the signal transmitting wire layer 9.

It should be noted that the present disclosure is not limited by above embodiments. Specific positions of the first signal wire layer 10, the second signal wire layer 20 and the third signal wire layer 40 may be interchanged, and positions of the pixel electrode layer 7, the common electrode 8 and the signal transmitting wire layer 9 also may be interchanged.

In some embodiments, if any one of the first signal wire layer 10, the second signal wire layer 20 and the third signal wire layer 40 is disposed on the same layer of any one layer in the display region, the layers on the same layer may be formed with the same material, such that they can be formed in the same process to reduce the manufacturing processes. Therefore, formation efficiency may be improved and cost may be reduced.

In the array substrate provided in some embodiments, multiple signal wire layers are disposed in different layers which are stacked with each other. Therefore, to arrange the wires with the same quantity as in the prior art, the wires required to be formed in each of the layers in the present disclosure can be reduced. As such, the wire region of the array substrate can have a smaller size, and thus the whole frame region of a display panel including such an array substrate can also be smaller.

Figure 37:
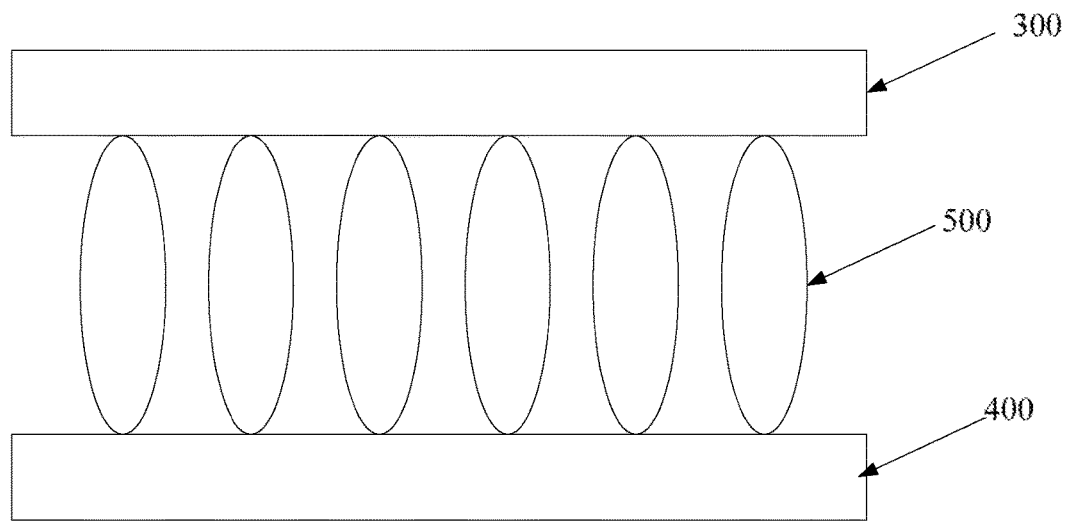
FIG. 37 is a cross section of a display panel according to another embodiment of the present disclosure.

Furthermore, a display panel is provided according to disclosed embodiments. As shown in FIG. 37, the display panel includes an array substrate 300 and a color film substrate 400 which are face to face with each other. A liquid crystal display layer 500 is disposed between the array substrate 300 and the color film substrate 400. The array substrate 300 may be any one of the array substrate described in above embodiments.

As the array substrate provided in embodiments of the present disclosure has a smaller wire region, compared with conventional array substrates and under the circumstance that the wire quantity is the same, it can have a smaller frame region. Therefore, the display panel including such an array substrate may have a smaller frame region.

Figure 38:
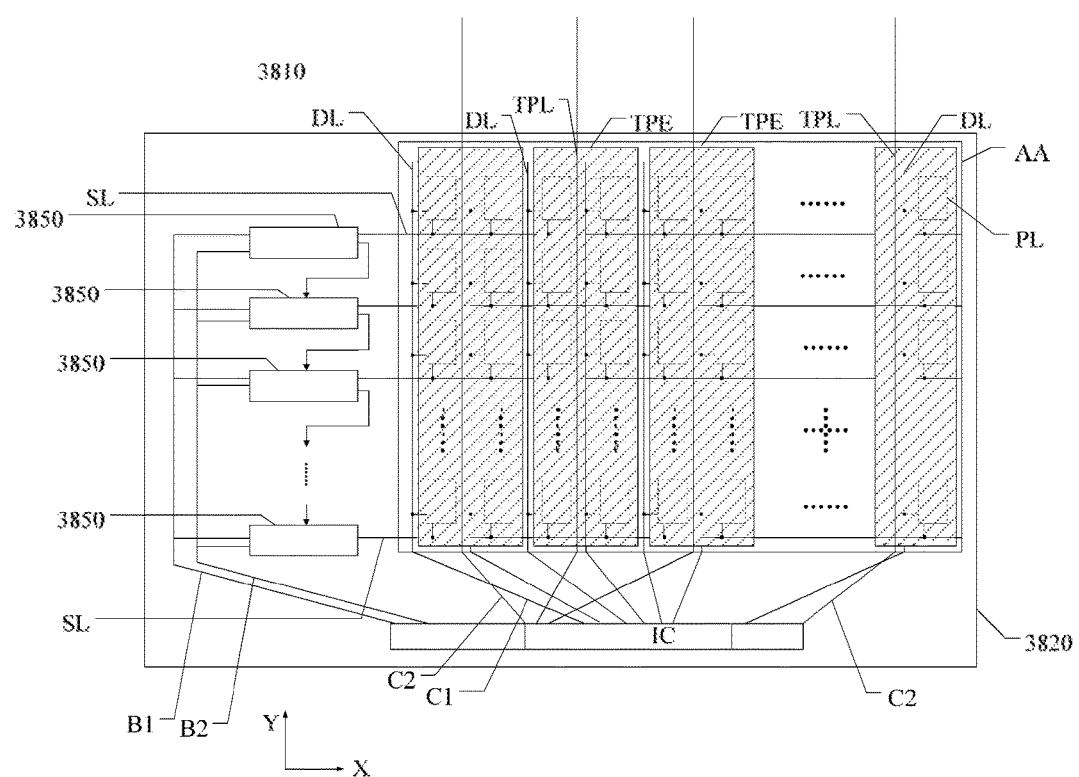
FIG. 38 is a schematic diagram of a display panel integrated with a touch control function according to an embodiment of the present disclosure.

A display panel integrated with a touch control function is further provided according to an embodiment of the present disclosure. Reference is made to FIG. 38, which is a schematic diagram of a display panel integrated with a touch control function according to an embodiment of the present disclosure. The display panel 3810 includes a substrate

3820, multiple display pixels PL, multiple data lines DL and multiple touch control signal lines TPL. The multiple data lines DL and multiple touch control signal lines TPL are arranged on the substrate 3820. The multiple data lines DL are configured to supply display signals to the display pixels PL. The multiple touch control signal lines TPL are configured to transmit control signals for the touch control electrodes TPE. Outside the display region, lead lines of the multiple data lines DL includes first lead lines C1, and lead lines of the multiple touch control signal lines TPL includes second lead lines C2. The data lines DL are connected to an integrated circuit IC through the first lead lines C1. The integrated circuit IC supplies the display signals to each of the display pixels PL through the data lines DL. The touch control signal lines TPL are connected to the integrated circuit IC through the second lead lines C2. The integrated circuit IC supplies touch control driving signals to each of the touch control electrodes TPE through the touch control signal lines TPL. Alternatively, touch control detecting signals generated by the touch control electrodes TPE are inputted into the integrated circuit IC for processing through the touch control signal lines TPL. Both the touch control driving signals and the touch control detecting signals are referred to as the touch control signals. The touch control signal lines TPL act as transmitting the control signals. Generally, the connection pins for the touch control signals are arranged on one or both ends of the integrated circuit IC. Accordingly, the connection pins for the display signals are arranged on the other end or in the middle of the integrated circuit IC.

The display panel integrated with a touch control function according to the embodiment of the present disclosure may be a liquid crystal display panel. Referring to FIG. 38, the display panel integrated with a touch control function 3810 includes multiple display pixels PL. Each of the display pixels PL includes a pixel electrode, a common electrode, and a thin film transistor. The pixel electrode is electrically connected to the drain of the thin film transistor. The source of the thin film transistor is electrically connected to the data line DL. The gate of the thin film transistor may be electrically connected to a scanning line SL. The scanning line SL controls the thin film transistor to be turned on or off through a signal generated by the gate drive unit 3850. Therefore, the scanning lines SL control the display signal carried by the data line DL to be inputted into the display pixel. The pixel electrode receives the display signal. The common electrode receives the common signal. The pixel electrode in the display pixel and the common electrode form an electric field to control the rotation of the liquid crystals so as to achieve displaying. Generally, the common electrode in each display pixel receives a same common signal. The display panel integrated with a touch control function according to the embodiment of the present disclosure includes a common electrode layer. The common electrode layer includes multiple sub-electrodes insulated from one another. The sub-electrodes are obtained by dividing the common electrode layer. One sub-electrode may be used as a common electrode for multiple display pixels. At the same time, the sub-electrodes may be reused as the touch control electrodes. In a case that the sub-electrodes are reused as the touch control electrodes, the display panel integrated with a touch control function may operate in a display operating state or a touch control operating state. The display operating state and the touch control operating state may be time multiplexed. Specifically, the display operating state is a normal state for the display panel integrated with a touch control function. In the display operating state, the sub-electrodes are supplied with the common signals or may be connected to ground. In the touch control operating state, displaying is suspended, and the sub-electrodes transmit the touch control signals through the touch control signal lines. The sub-electrodes reused as the touch control electrodes may simplify process of manufacturing the display panel integrated with a touch control function, and may save the manufacturing time and manufacturing cost. In addition, when the touch control electrodes are arranged separately in the display panel integrated with a touch control function, an additional insulating layer is also required to prevent the touch control electrodes from being interfered by other units. Therefore, the sub-electrodes reused as the touch control electrodes may also simplify a layer structure of the display panel integrated with a touch control function, thereby reducing a thickness of the display panel integrated with a touch control function.

The touch control function of the display panel integrated with a touch control function can be implemented in a mutual capacitance manner or in a self capacitance manner. The sub-electrodes may also have multiple configurations accordingly. Referring to FIG. 38, in a first configuration, the common electrode layer includes multiple first stripe-shaped sub-electrodes TPE. The first stripe-shaped sub-electrodes TPE may be reused as the touch control electrodes TPE. Thus, the first stripe-shaped sub-electrodes TPE and the touch control electrodes TPE are the same, and an extending direction of the first stripe-shaped sub-electrodes TPE is the same as that of the data lines DL. The multiple first stripe-shaped sub-electrodes TPE are sequentially arranged in a direction intersecting the extension direction of the data lines DL. Specifically, the first stripe-shaped sub-electrodes TPE extend in a direction Y. The data lines DL also extend in the direction Y. The multiple the first stripe-shaped sub-electrodes TPE are sequentially arranged in a direction X. The direction X may intersect with the direction Y. As shown in FIG. 38, one first stripe-shaped sub-electrode TPE corresponds to multiple display pixels PL, and thus one first stripe-shaped sub-electrode TPE is used as a common electrode of the multiple display pixels PL. In the first configuration, the first stripe-shaped sub-electrodes TPE is used as either the touch control driving electrode or the touch control detecting electrode in the mutual capacitance touch control manner. In the mutual capacitance touch control manner, the touch control driving electrodes may be supplied with pulsed touch control driving signals. A capacitor is formed between the touch control driving electrode and the touch control detecting electrode. When a touch control event occurs on the display panel integrated with a touch control function, coupling between the touch control driving electrode and the touch control detecting electrode near a touch position may be affected, and thus a capacitance between the touch control driving electrode and the touch control detecting electrode near the touch position is changed. The touch position is detected as described in the following. The touch control driving signals are supplied to the touch control driving electrodes in sequence. At the same time, the touch control detecting electrodes output the touch control detecting signals. Thus, the capacitances at the intersections of the touch control driving electrodes and the touch control detecting electrodes are obtained to form two-dimensional capacitance distribution data for the entire display panel integrated with a touch control function. Based on the two-directional capacitance distribution data for the display panel integrated with a touch control function, coordinates of the touch position may be calculated.

Figure 39:
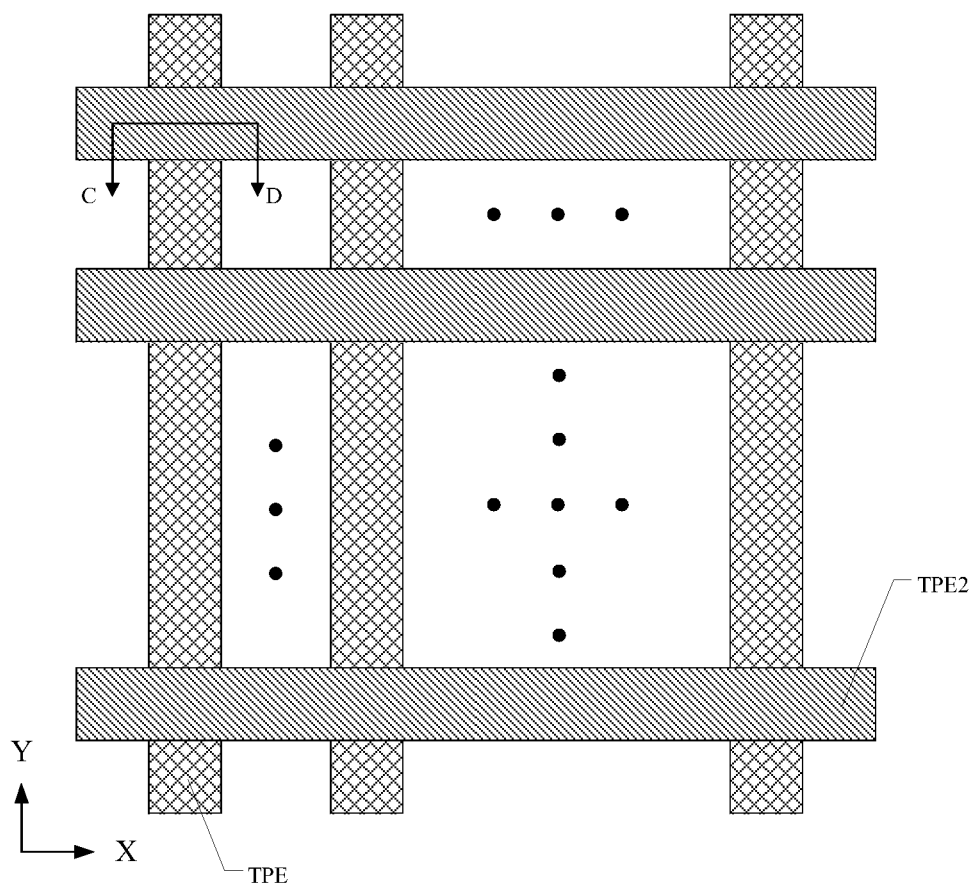
FIG. 39 is a schematic diagram of a touch control structure in a mutual capacitance manner according to an embodiment of the present disclosure.
Figure 40:
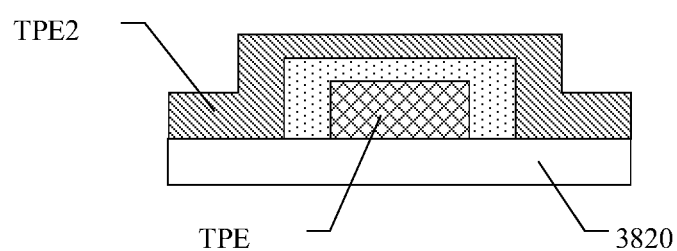
FIG. 40 is a cross-sectional view of a touch control structure in a mutual capacitance manner along the CD line as shown in FIG. 39 according to an embodiment of the present disclosure.
Figure 41:
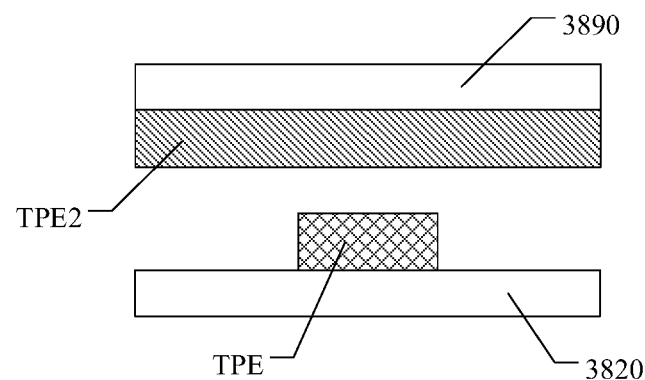
FIG. 41 is a cross-sectional view of a touch control structure in a mutual capacitance manner along the CD line as shown in FIG. 39 according to an embodiment of the present disclosure.
Figure 42:
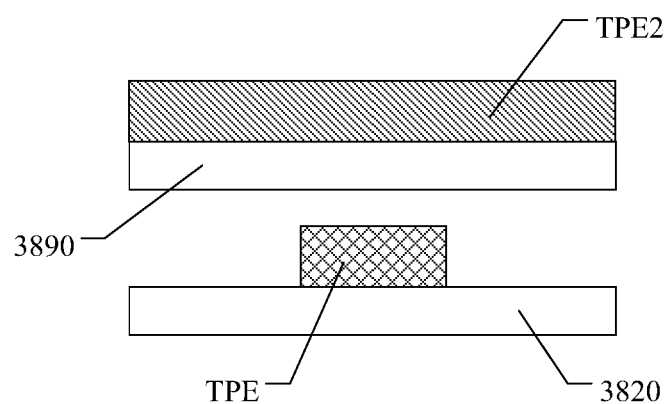
FIG. 42 is a cross-sectional view of a touch control structure in a mutual capacitance manner along the CD line as shown in FIG. 39 according to an embodiment of the present disclosure.

FIG. 39 is a schematic diagram of a touch control structure in a mutual capacitance manner according to an embodiment of the present disclosure. The first stripe-shaped sub-electrodes TPE may be used as the touch control driving electrodes. In the touch control operating state, the touch control signal lines supply the touch control driving signals to the first stripe-shaped sub-electrodes TPE. Accordingly, the display panel integrated with a touch control function may further include multiple second stripe-shaped sub-electrodes TPE2. The multiple the second stripe-shaped sub-electrodes TPE2 are sequentially arranged in parallel. The second stripe-shaped sub-electrodes TPE2 are configured to supply the touch control detecting signals. That is, the second stripe-shaped sub-electrodes TPE2 may be used as the touch control detecting electrodes. An extension direction of the second stripe-shaped sub-electrodes TPE2 intersects with that of the first stripe-shaped sub-electrodes TPE. Specifically, as shown in FIG. 39, the first stripe-shaped sub-electrodes TPE extend in the direction Y. The second stripe-shaped sub-electrodes TPE2 extend in the direction X. The multiple the second stripe-shaped sub-electrodes TPE2 are sequentially arranged in parallel in the direction Y. The direction X intersects with the direction Y. The direction X and the direction Y may be perpendicular to each other, or the direction X and the direction Y may not be perpendicular to each other as long as the direction X intersects with the direction Y. Further, other alternative relative positions of the first stripe-shaped sub-electrodes TPE and the second stripe-shaped sub-electrodes TPE2 are described as below. FIG. 40 is a cross-sectional view of a touch control structure in a mutual capacitance manner along the CD line as shown in FIG. 39 according to an embodiment of the present disclosure. As shown in FIG. 40, the first stripe-shaped sub-electrodes TPE and the second stripe-shaped sub-electrodes TPE2 may be arranged on the substrate 3820. The first stripe-shaped sub-electrodes TPE may be arranged between the substrate 3820 and the second stripe-shaped sub-electrode TPE2. An insulating layer may be arranged between the first stripe-shaped sub-electrode TPE and the second stripe-shaped sub-electrode TPE2 to make the first stripe-shaped sub-electrodes TPE insulated from the second stripe-shaped sub-electrodes TPE2. FIG. 41 is a cross-sectional view of a touch control structure in a mutual capacitance manner along the CD line as shown in FIG. 39 according to another embodiment of the present disclosure. As shown in FIG. 41, the first stripe-shaped sub-electrodes TPE are arranged on the substrate 3820. The display panel integrated with a touch control function further includes an opposite substrate 3890 arranged opposite to the substrate 3820. The second stripe-shaped sub-electrodes TPE2 are arranged on the opposite substrate 3890. The second stripe-shaped sub-electrodes TPE2 are arranged on a side of the opposite substrate 3890 facing the substrate 3820. Liquid crystal is filled between the substrate 3820 and the opposite substrate 3890. FIG. 42 is a cross-sectional view of a touch control structure in a mutual capacitance manner along the CD line as shown in FIG. 39 according to another embodiment of the present disclosure. As shown in FIG. 42, the first stripe-shaped sub-electrodes TPE are arranged on a substrate 3820. The display panel integrated with a touch control function may also include an opposite substrate 3890 arranged opposite to the substrate 3820. The second stripe-shaped sub-electrodes TPE2 are arranged on the opposite substrate 3890. Different from the relative positions as shown in FIG. 41, the second stripe-shaped sub-electrodes TPE2 are arranged on a side of the opposite substrate 3890 away from the substrate 3820. In the above embodiments, the second stripe-shaped sub-electrodes used as the touch control detecting electrodes are arranged on the side of the first stripe-shaped sub-electrodes used as the touch control driving electrodes away from the substrate. Usually, a touch control operation is implemented on the side of the first stripe-shaped sub-electrodes away from the substrate, on the side of the opposite substrate away from the first substrate in a case that the opposite substrate exists. Therefore, the second stripe-shaped sub-electrodes, that is, the touch control detecting electrodes arranged on the side of the first stripe-shaped sub-electrodes away from the first substrate can make the touch control detecting electrodes closer to a touch control operation surface, which makes the touch control operation greatly affect the touch control detecting electrodes. As a result, the touch control detecting electrodes generate the touch control signals more accurately, thereby making a result of the touch control operation more accurate. Preferably, the second stripe-shaped sub-electrodes, that is, the touch control detecting electrodes are arranged on the side of the opposite substrate away from the substrate, which makes the result of the touch control operation more accurate.

Figure 43:
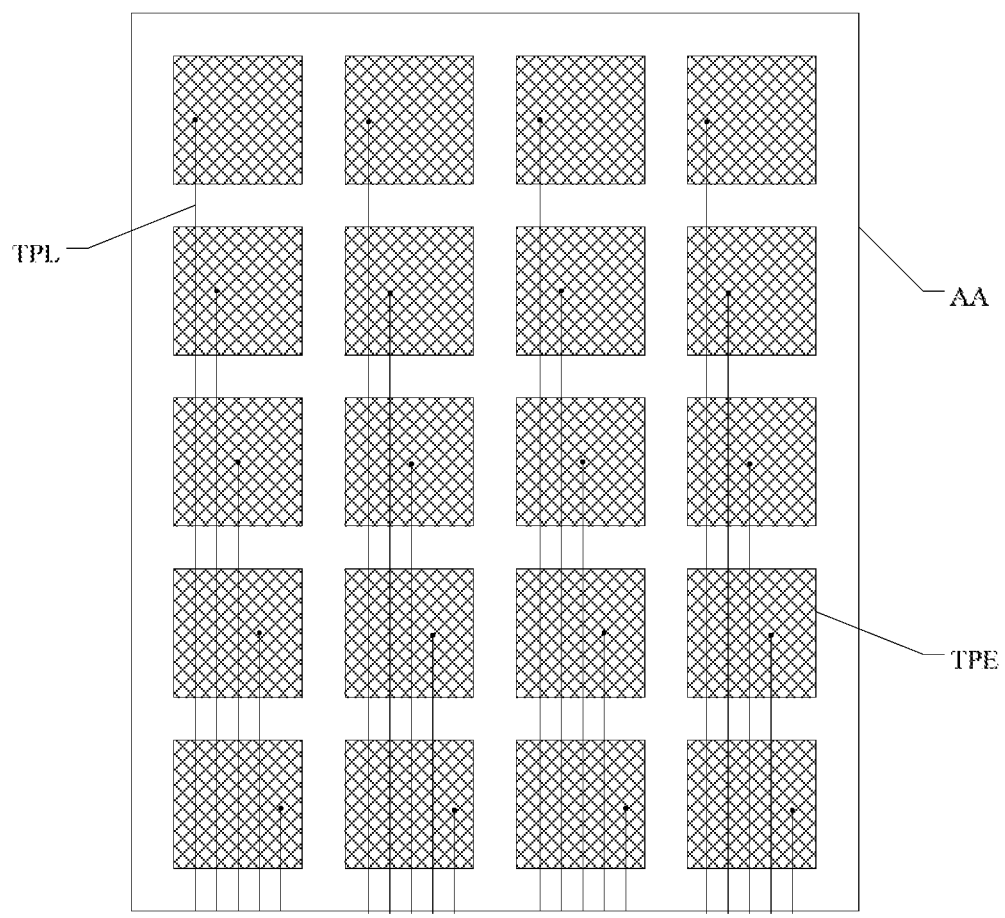
FIG. 43 is a top view of a display panel integrated with a touch control function in a self capacitance manner according to an embodiment of the present disclosure.

In a second configuration, the stripe-shaped sub-electrodes are reused as the touch control electrodes in a self capacitance manner. FIG. 43 is a top view of a display panel integrated with a touch control function in a self capacitance manner according to an embodiment of the present disclosure. As shown in FIG. 43, the display panel integrated with a touch control function includes a common electrode layer. The common electrode layer includes multiple square-shaped sub-electrodes TPE arranged in an array. The square-shaped sub-electrodes TPE are reused as the touch control electrodes in a self capacitance manner. In a self capacitance touch control manner, the touch control driving signals are inputted into the touch control electrodes, and the touch control electrodes output the touch control detecting signals at the same time. When a touch control event occurs on the display panel integrated with a touch control function, a capacitance between the touch control electrode near the touch position and the ground may be changed, and the touch control detecting signal outputted by the touch control electrode is changed. Each touch control electrode represents one coordinate point. The touch control detecting signals from all the touch control electrodes may be processed to determine the touch position. As shown in FIG. 43, each touch control electrode TPE are electrically connected to at least one touch control signal line TPL to ensure that each touch control electrode TPE may independently transmit, through the touch control signal line TPL, the touch control signals (including the touch control driving signal and the touch control detecting signal).

Figure 44:
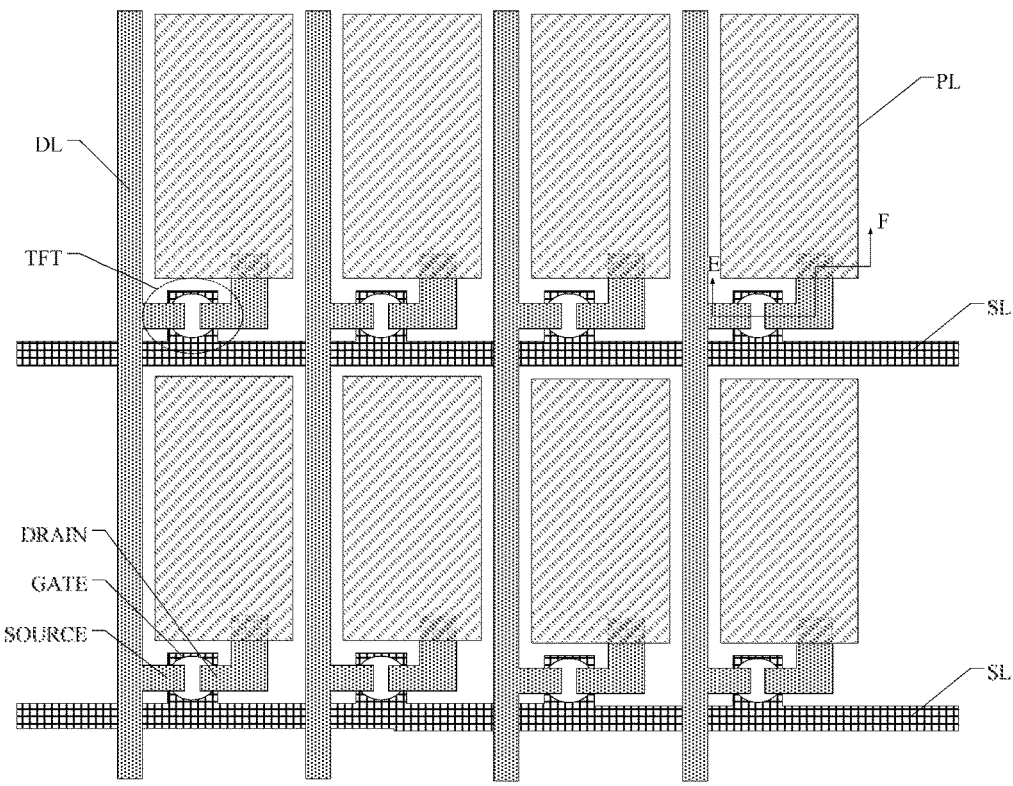
FIG. 44 is a schematic diagram of a display region of a display panel integrated with a touch control function according to an embodiment of the present disclosure.
Figure 45:
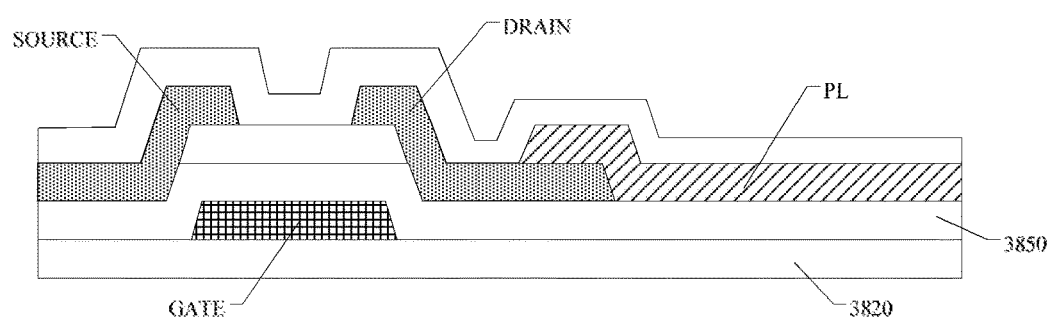
FIG. 45 is a cross-sectional view of a display region of a display panel integrated with a touch control function as shown in FIG. 44 along the EF line.

FIG. 44 is a schematic diagram of a display region of a display panel integrated with a touch control function according to an embodiment of the present disclosure. As shown in FIG. 44, a display region of the display panel integrated with a touch control function includes multiple scanning lines SL, data lines DL, display pixels PL, and thin film transistors TFT. The source electrode SOURCE of the thin film transistor TFT is electrically connected to the data line DL. The drain electrode DRAIN of the thin film transistor TFT is electrically connected to the display pixel PL. The gate electrode GATE of the thin film transistor TFT is electrically connected to the scanning line SL. The scanning lines SL control the thin film transistors to be turned on or off via scanning signals generated by a scanning driving circuit. Therefore, the scanning lines SL control the display signal carried by the data line DL to be inputted into the display pixel PL. The source electrodes SOURCE and the drain electrodes DRAIN of the thin film transistors TFT and the data lines DL may be formed at the same time by etching a source and drain electrode metal layer. The gate electrodes GATE of the thin film transistors and the scanning lines may be formed at the same time by etching a gate electrode metal layer. Since the data lines DL and the scanning lines SL intersect with one another on the substrate and are insulated from one another, the source and drain electrode metal layer and the gate electrode metal layer are not in a same metal layer. Specifically, reference is made to FIG. 45, which is a cross-sectional view of a display region of a display panel integrated with a touch control function as shown in FIG. 44 along the EF line. The gate electrode GATE is arranged on the substrate 3820. The source electrode SOURCE and the drain electrode DRAIN are arranged on the gate electrode GATE. An insulating layer 250 is arranged between the source and drain electrodes SOURCE and DRAIN and the gate electrode GATE.

Figure 46:
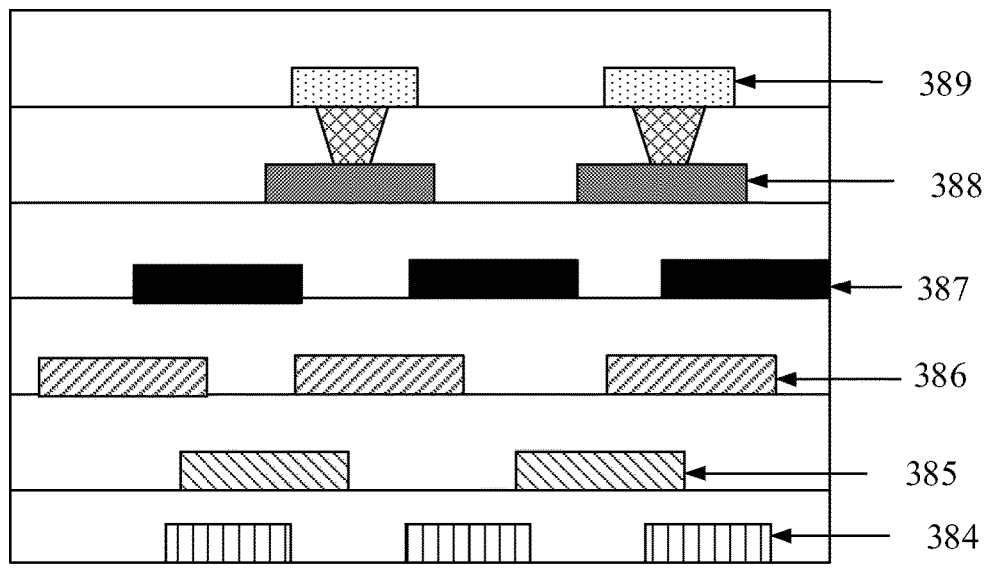
FIG. 46 is a cross-sectional view of a display region of an array substrate according to an embodiment of the present disclosure.

FIG. 46 is a cross-sectional view of a display region of an array substrate according to an embodiment of the present disclosure. The display region of the array substrate includes an active layer 384, a gate layer 385, a source and drain layer 386, a pixel electrode layer 387, a common electrode layer 388 and a signal transmission wire layer 389. The common electrode layer 388 includes multiple electrodes as described above. That is, the multiple electrodes are used as common electrodes during a display stage, and are used as touch electrodes during a touch control stage. The signal transmission wire layer 389 includes multiple touch control lines electrically connected to the touch control electrodes. The touch control line supplies a common voltage signal to the touch control electrode in the display stage, and supplies a touch control signal to the touch control electrode in the touch control stage.

The frame region includes a gate drive unit which includes multiple thin film transistors TFT. Each TFT includes a source electrode, a drain electrode, and a gate electrode.

Figure 47:
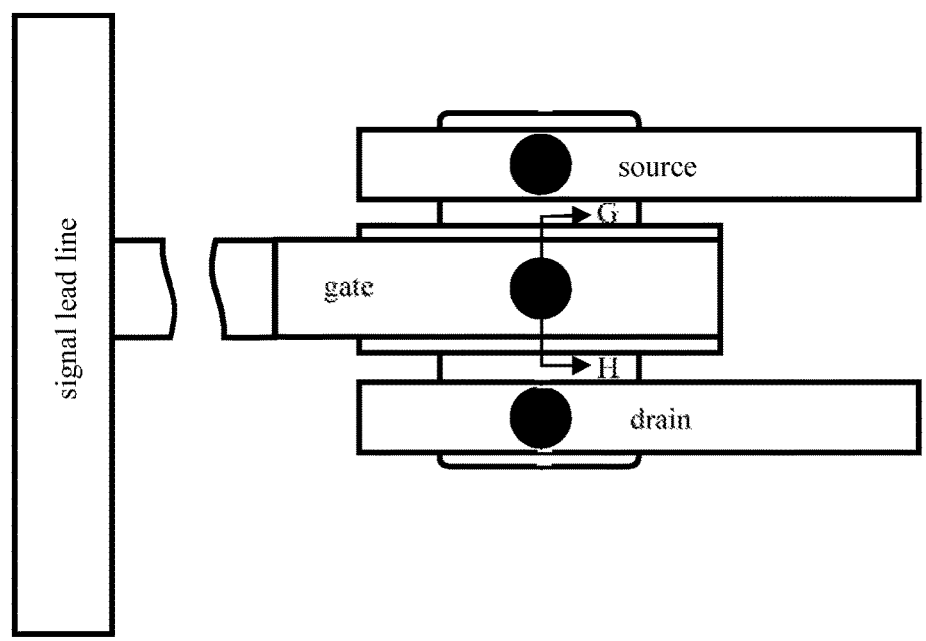
FIG. 47 is a schematic diagram of connection between a gate and a signal lead line according to an embodiment of the present disclosure.

In a first case, as shown in FIG. 47, the gate electrode is electrically connected to a signal lead line of the gate drive unit. The gate electrode is further electrically connected to a driving circuit IC through the signal lead line B1 or B2 (as shown in FIG. 38).

In an implementation, the signal lead line may be the first signal wire of the present application. The signal lead line may be arranged on one layer, or on two or more layers.

In an implementation, the signal lead line may be arranged on a single layer, and the signal lead line is electrically connected to the gate of TFT.

Hereinafter several implementations of the gate drive unit 3850 will be described in detail.

Figure 48:
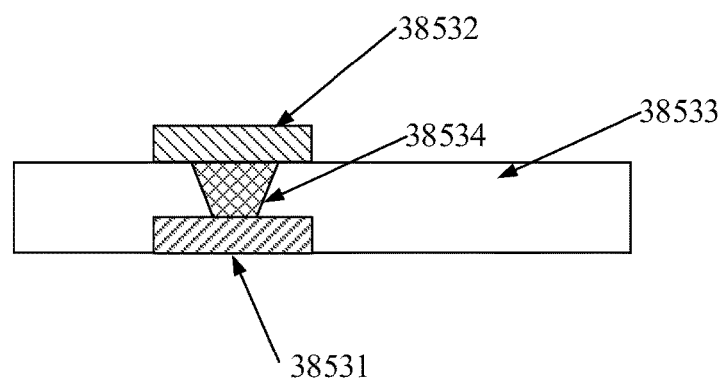
FIG. 48 is a cross-sectional view of a gate structure of a TFT in a gate drive unit along the GH line as shown in FIG. 47 according to an embodiment of the present disclosure.

The gate of TFT is usually formed on a single layer and arranged on the same layer as the gate layer 385 in the display region. In an embodiment of the present application as shown in FIG. 48 which is a cross-sectional view of a gate structure of a TFT in a gate drive unit along the GH line as shown in FIG. 47 according to an embodiment of the present disclosure, for a poly-silicon product, the gate of TFT includes a stack of a first gate conductive layer 38531 and a second gate conductive layer 38532, and a first gate insulating layer 38533 located between the first gate conductive layer 38531 and the second gate conductive layer 38532. A first gate via 38534 is arranged between the first gate conductive layer 38531 and the second gate conductive layer 38532. The second gate conductive layer 38532 is electrically connected to the first gate conductive layer 38531 through the first gate via 38534.

Figure 49:
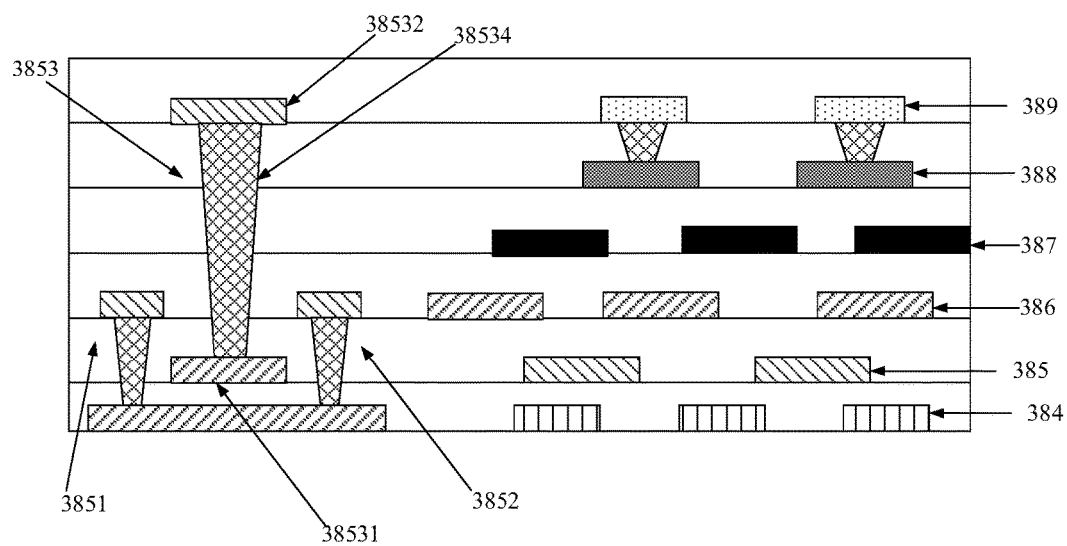
FIG. 49 is a cross-sectional view of a display panel including a display region and a TFT in a frame region according to an embodiment of the present disclosure.

In an implementation of the present disclosure as shown in FIG. 49, the second gate conductive layer 38532 of the gate 3853 is located on the same layer as the signal transmission wire layer 389 of the display region. The material of the second gate conductive layer 38532 may be the same as the material of the signal transmission wire layer 389 of the display region. For example, the signal transmission wire layer 389 may be a metal electrode layer, and the second gate conductive layer 38532 may also be a metal electrode layer. In such a way, the second gate conductive layer 38532 and the signal transmission wire layer 389 can be formed at the same time, thereby simplifying the process. In addition, the first gate conductive layer 38531 may be formed independently, or may be located on the same layer as the gate layer 385 in the display region, or may be located on the same layer as the source and drain layer 386, or may be located on the same layer as the pixel electrode layer 387, or may be located on the same layer as the common electrode layer 388, which is not limited in the present disclosure, as long as it is ensured that the first gate conductive layer 38531 and the second gate conductive layer 38532 are arranged on different layers, and are electrically connected to each other. Therefore, a gate forming area of the gate drive units is decreased, and the area of the frame region of the substrate is decreased.

On the basis of the above embodiments, in an implementation, the source 3851 of the TFT includes a first source conductive layer located on the same layer as the active layer 384 of the display region and a second source conductive layer located on the same layer as the source and drain layer 386 of the display region. The drain 3852 of the TFT includes a first drain conductive layer located on the same layer as the active layer 384 of the display region and a second drain conductive layer located on the same layer as the source and drain layer 386 of the display region. The first source conductive layer and the first drain conductive layer are formed as a whole. The first source conductive layer is electrically connected to the second source conductive layer through a via, and the first drain conductive layer is electrically connected to the second drain conductive layer through a via.

In an embodiment of the present application, after the gate 3853 of the TFT is formed, the gate 3853 is electrically connected to the signal lead line B1 or B2 of the gate drive unit 3850.

Figure 50:
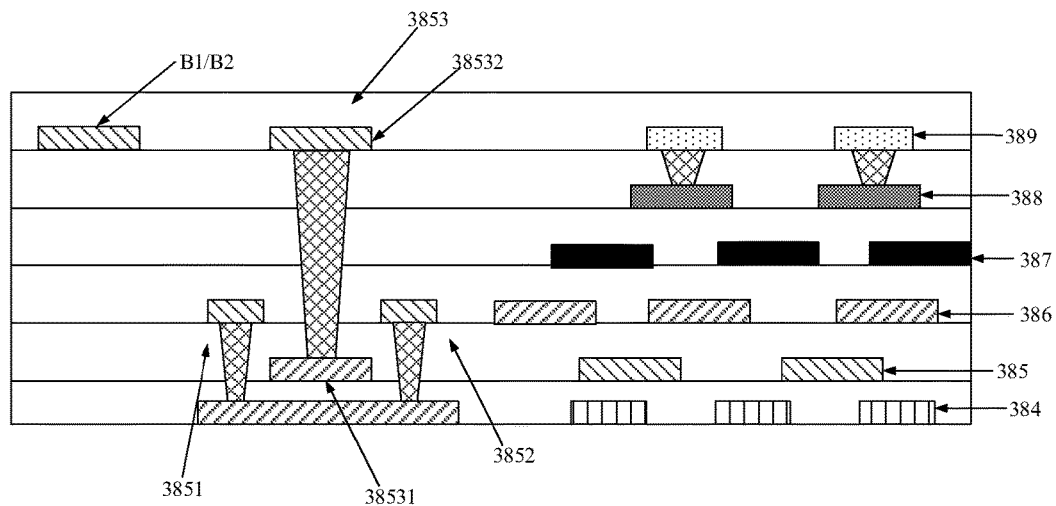
FIG. 50 is a cross-sectional view of a display panel including a display region, and a TFT and a signal line in a frame region according to an embodiment of the present disclosure.

In a case that the signal lead line B1 or B2 is arranged on a single layer, the signal lead line B1 or B2 may be arranged in a separate layer different from all the layers in the display region, or may be arranged on a same layer as any one layer in the display region. In an implementation, the signal lead line B1 or B2 may be located on the same layer as the signal transmission wire layer 389 of the display region. In another implementation, the signal lead line B1 or B2 may be located on the same layer as any one of the gate conductive layers of the gate of TFT of the gate drive unit. In another implementation, the signal lead line B1 or B2 may be located on the same layer as any one of the gate conductive layers of the gate of TFT of the gate drive unit and the signal transmission wire layer 389 of the display region. As shown in FIG. 50, the signal lead line B1 or B2 is located on the same layer as the second gate conductive layer 38532 of the gate of TFT of the gate drive unit and the signal transmission line layer 389 of the display region. In this case, the signal transmission line layer 389, the second gate conductive layer 38532, and the signal lead line B1 or B2 may be formed in one process, thereby simplifying the processes. In a case that the signal lead line B1 or B2 and the second gate conductive layer 38532 are arranged on the same layer, the gate conductive layer 38532 can be directly connected to the signal lead line B1 or B2, thereby simplifying the processes. Alternatively, the signal lead line B1 or B2 may also be electrically connected to the first gate conductive layer 38531 through a via.

Figure 51:
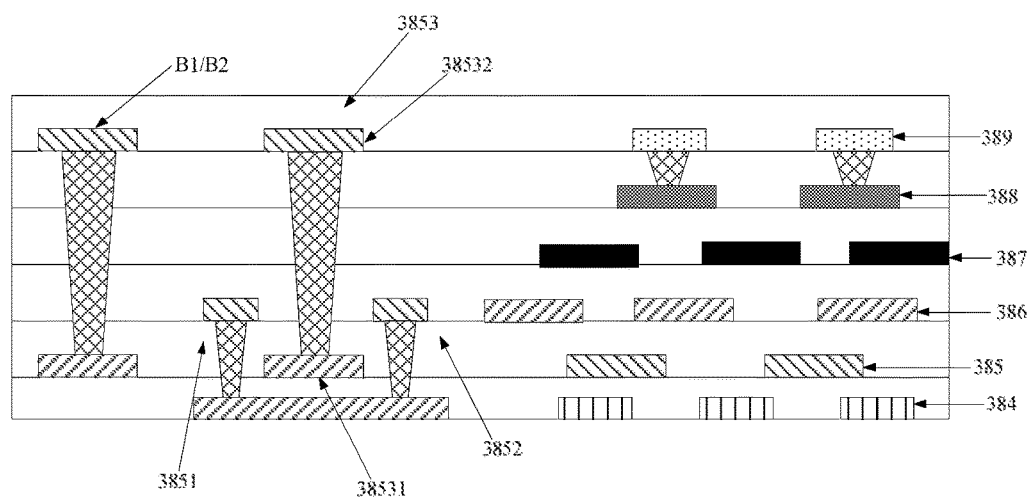
FIG. 51 is a cross-sectional view of a display panel including a display region, and a TFT and a signal line in a frame region according to an embodiment of the present disclosure.

In a case that the signal lead line B1 or B2 is arranged on two layers, any one of the two layers of the signal lead line may be arranged on a separate layer different from all the layers in the display region, and may also be arranged on a same layer as any one layer in the display region, as long as the two layers of the signal lead line are not located on the same layer. Specific method for arranging the signal lead line can refer to the description of the first signal wire in the embodiments of the present application. In an implementation, one layer of the signal lead line is located on the same layer as the signal transmission wire layer 389 of the display region. In another implementation, one layer of the signal lead line is located on the same layer as any one layer of the gate of TFT of the gate drive unit. In another implementation, one layer of the signal lead line is located on the same layer as any one layer of the gate of TFT of the gate drive unit and the signal transmission wire layer 389 of the display region. As shown in FIG. 51, one layer of the signal lead line is located on the same layer as the second gate conductive layer 38532 of TFT and the signal transmission wire layer 389 of the display region. In this case, the signal transmission wire layer 389, the second gate conductive layer 38532, and one layer of the signal lead line may be formed at the same time, thereby simplifying the process. Another layer of the signal lead line may be formed in a separate layer, or may be located on the same layer as any one layer of the display region other than the signal transmission wire layer 389. In a case that one layer of the signal lead line is located on the same layer as the second gate conductive layer 38532, the layer of the signal lead line can be directly connected to the second gate conductive layer 38532, thereby simplifying the process. The signal lead line may also be electrically connected to the gate of TFT in other ways, as long as any one layer of the signal lead line is electrically connected to any one of the gate conductive layers of the gate.

Figure 52:
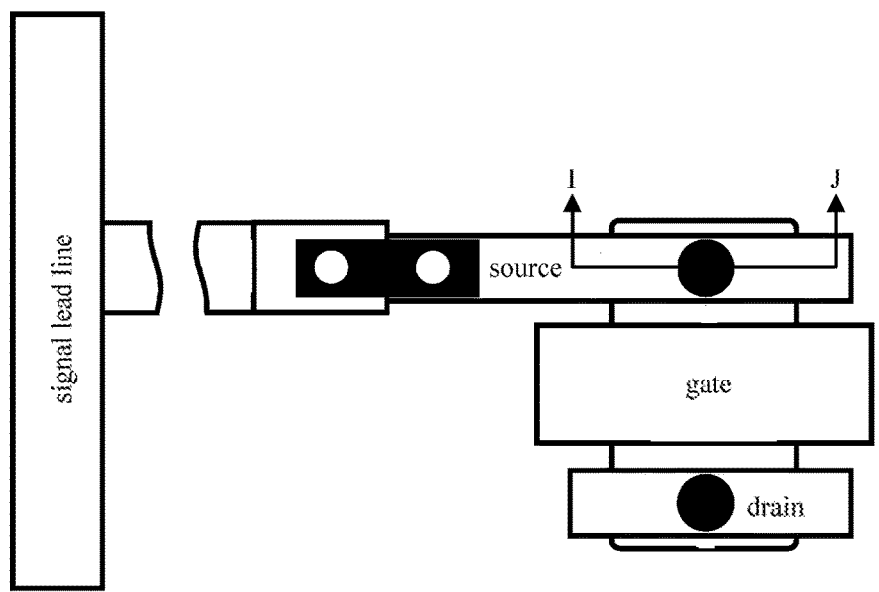
FIG. 52 is a schematic diagram of connection between a source and a signal lead line according to an embodiment of the present disclosure.

In a second case, as shown in FIG. 52, the source is electrically connected to the signal lead line. The source is further electrically connected to the driving circuit IC through the signal lead line B1 or B2 (as shown in FIG. 38).

In an implementation, the signal lead line may be the first signal wire of the present application. The signal lead line may be arranged on one layer, or on two or more layers.

In an implementation, the signal lead line may be arranged on a single layer, and the signal lead line is electrically connected to the source electrode of TFT.

Figure 53:
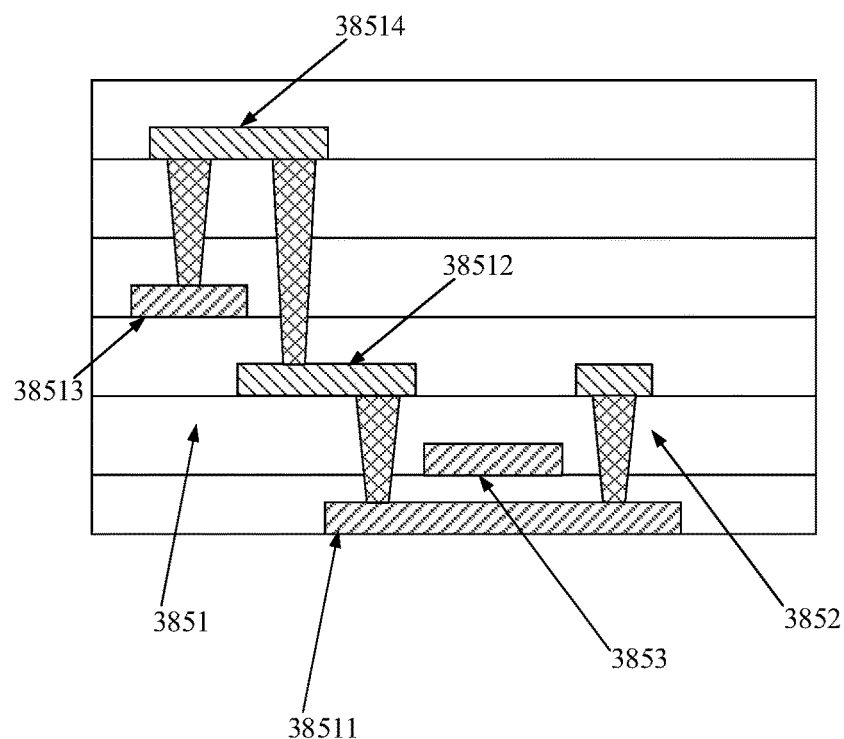
FIG. 53 is a cross-sectional view of a TFT in a gate drive unit along the IJ line as shown in FIG. 52 according to an embodiment of the present disclosure.

In an embodiment of the present application as shown in FIG. 53 which is a cross-sectional view of a TFT in a gate drive unit along the IJ line as shown in FIG. 52 according to an embodiment of the present disclosure, for a poly-silicon product, the source 3851 of the TFT includes a first source conductive layer 38511, a second source conductive layer 38512, a third source conductive layer 38513 and a fourth source conductive layer 38514. The first source conductive layer 38511 is electrically connected to the second source conductive layer 38512 through a first source via. The second source conductive layer is electrically connected to the fourth source conductive layer through a second source via. The third source conductive layer is electrically connected to the fourth source conductive layer through a third source via. The drain 3852 includes a first drain conductive layer and a second drain conductive layer, and the first drain conductive layer and the second drain conductive layer are electrically connected through a first drain via. The first source conductive layer and the first drain conductive layer are located on a same layer, and are formed as a whole.

Figure 54:
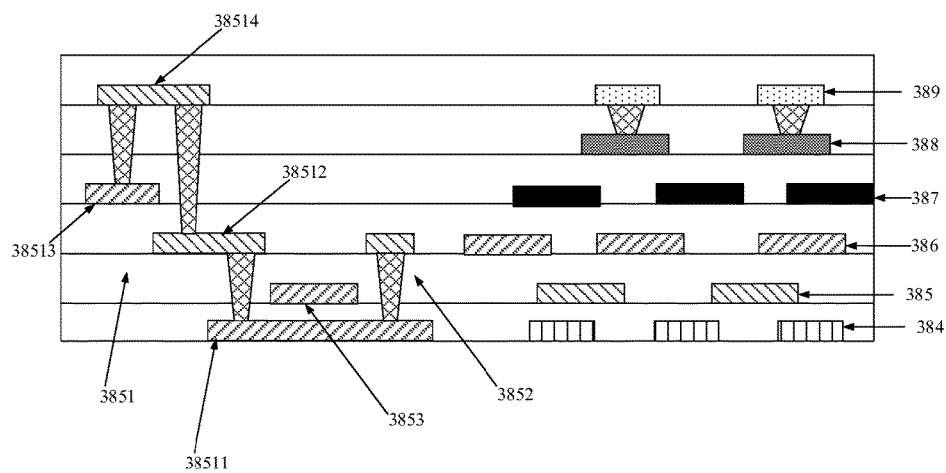
FIG. 54 is a cross-sectional view of a display panel including a display region and a TFT in a frame region according to an embodiment of the present disclosure.

As shown in FIG. 54, in an implementation of the present application, the fourth source conductive layer 38514 is located on the same layer as the signal transmission wire layer 389 of the display region. In an implementation, the gate of TFT is a single layer structure, and is located on the same layer as the gate layer 385 of the display region. In an implementation, the first source conductive layer and the first drain conductive layer of TFT are located on the same layer as the active layer 384 of the display region. In an implementation, the second source conductive layer and the second drain conductive layer of TFT are located on the same layer as the source and drain layer 386 of the display region. In an implementation, the third source conductive layer of TFT is located on the same layer as the pixel electrode layer 387 or the common electrode layer 388 of the display region.

In an implementation, the fourth source conductive layer 38514 is located on the same layer as the signal transmission wire layer 389 of the display region, and the fourth source conductive layer and the signal transmission wire layer is made of ITO. In such a way, the fourth source conductive layer and the signal transmission wire layer 389 may be formed in one process.

In an embodiment of the present application, after the source 3851 of the TFT is formed, the source 3851 is electrically connected to the signal lead line B1 or B2 of the gate drive unit 3850, and thus the source 3851 is electrically connected to the driving circuit IC through the signal lead line B1 or B2.

In an implementation, the signal lead line B1 or B2 may be the first signal wire of the present application. The signal lead line B1 or B2 may be arranged on one layer, or on two or more layers.

Figure 55:
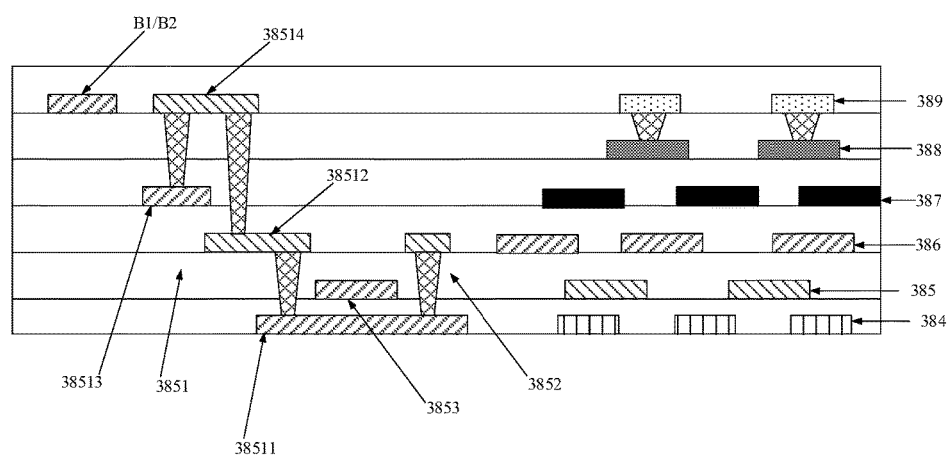
FIG. 55 is a cross-sectional view of a display panel including a display region, and a TFT and a signal line in a frame region according to an embodiment of the present disclosure.

In a case that the signal lead line B1 or B2 is arranged on a single layer, the signal lead line B1 or B2 may be arranged in a separate layer different from the layers in the display region, or may be arranged in a same layer as any one layer in the display region. In an implementation, the signal lead line B1 or B2 may be located on the same layer as the signal transmission wire layer 389 of the display region. In another implementation, the signal lead line B1 or B2 may be located on the same layer as any one of the source conductive layers of the source of TFT of the gate drive unit. In another implementation, the signal lead line B1 or B2 may be located on the same layer as any one of the source conductive layers of the source of TFT of the gate drive unit and the signal transmission wire layer 389 of the display region. As shown in FIG. 55, the signal lead line B1 or B2 is located on the same layer as the fourth source conductive layer 38514 of the source of TFT of the gate drive unit and the signal transmission line layer 389 of the display region. In this case, the signal transmission line layer 389, the fourth source conductive layer 38514, and the signal lead line B1 or B2 may be simultaneously formed, thereby simplifying the process. In a case that the signal lead line B1 or B2 and the fourth source conductive layer 38514 are arranged on the same layer, the fourth source conductive layer 38514 can be directly connected to the signal lead line B1 or B2, thereby simplifying the process. Alternatively, the signal lead line B1 or B2 may also be electrically connected to the first source conductive layer, the second source conductive layer, or the third source conductive layer through a via.

Figure 56:
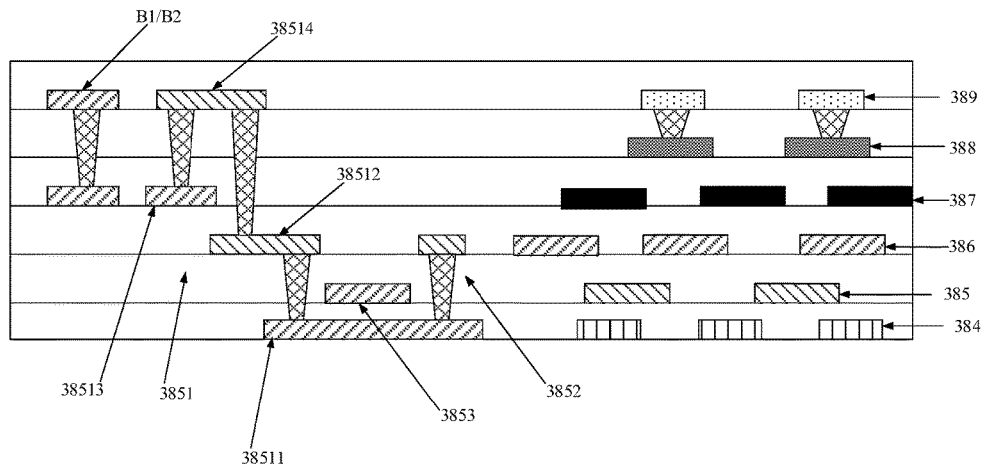
FIG. 56 is a cross-sectional view of a display panel including a display region, and a TFT and a signal line in a frame region according to an embodiment of the present disclosure.

In a case that the signal lead line B1 or B2 is arranged on two layers, any one of the two layers of the signal lead line may be arranged on a separate layer different from all the layers in the display region, and may also be arranged on a same layer as any one layer in the display region, as long as the two layers of the signal lead line are not located on the same layer. Specific method for arranging the signal lead line can refer to the description of the first signal wire in the embodiments of the present application. In an implementation, one layer of the signal lead line is located on the same layer as the signal transmission wire layer 389 of the display region. In another implementation, one layer of the signal lead line is located on the same layer as any one layer of the source of TFT of the gate drive unit. In another implementation, one layer of the signal lead line is located on the same layer as any one layer of the source of TFT of the gate drive unit and the signal transmission wire layer 389 of the display region. As shown in FIG. 56, one layer of the signal lead line is located on the same layer as the fourth source conductive layer 38514 of TFT and the signal transmission wire layer 389 of the display region. In this case, the signal transmission wire layer 389, the fourth source conductive layer 38514, and one layer of the signal lead line may be formed at the same time, thereby simplifying the process. Another layer of the signal lead line may be formed in a separate layer, or may be located on the same layer as any one layer of the display region other than the signal transmission wire layer 389. In a case that one layer of the signal lead line is located on the same layer as the fourth source conductive layer 38514, the layer of the signal lead line can be directly connected to the fourth source conductive layer 38514, thereby simplifying the process. The signal lead line may also be electrically connected to the gate of TFT in other ways, as long as any one layer of the signal lead line is electrically connected to any one of the source conductive layers of the source.

In a third case, the signal lead line B1 or B2 may be arranged in a single layer, and is electrically connected to the drain of the TFT. Referring to the second case, a structure of the drain of TFT include four layers, and a structure of the source of TFT include two layers, that is, the structures of the source and the drain in the second case are interchanged, and the signal line B1 or B2 is electrically connected to the drain. The details can be referred to the second case.

Figure 57:
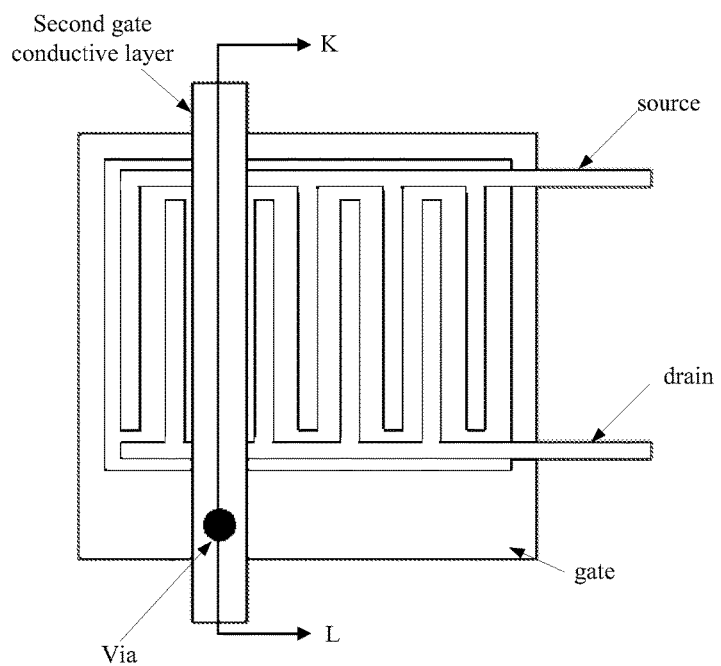
FIG. 57 is a schematic diagram of connection between a gate and a signal lead line according to an embodiment of the present disclosure.
Figure 58:
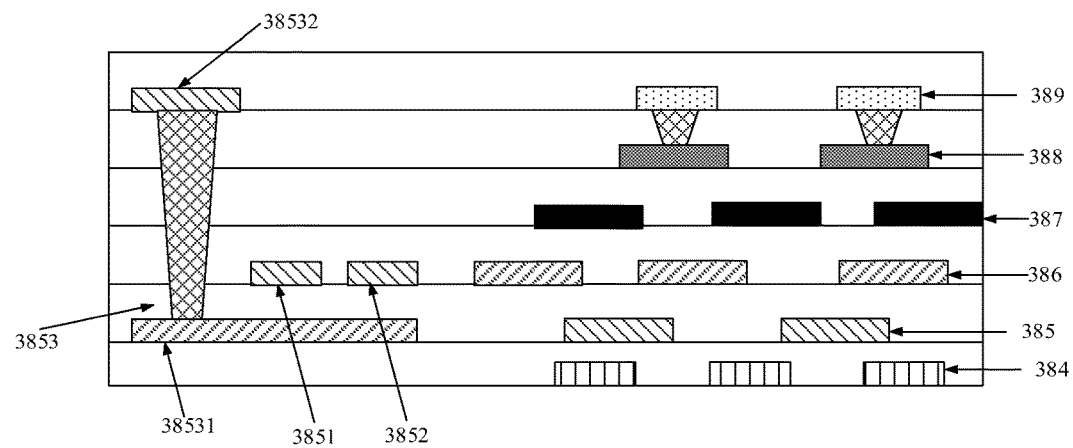
FIG. 58 is a cross-sectional view of a display panel including a display region and a TFT in a frame region according to an embodiment of the present disclosure, wherein the left part of the view is a cross-sectional view of the TFT along the KL line as shown in FIG. 57.

In an embodiment of the present application as shown in FIGS. 57 and 58, for a poly-silicon product, the gate of TFT includes a first gate conductive layer 38531 and a second gate conductive layer 38532. The first gate conductive layer is electrically connected to the second gate conductive layer through a first gate via. In an implementation, the second gate conductive layer is located on the same layer as the signal transmission wire layer 389 of the display region. In an implementation, the first gate conductive layer is located on the same layer as the gate layer 385 of the display region. In an implementation, the source 3851 and the drain 3852 are located on the same layer as the source and drain layer 386 of the display region.

In an embodiment of the present application, after the gate 3853 of the TFT is formed, the gate 3853 is electrically connected to the signal lead line B1 or B2 of the gate drive unit 3850, and is further electrically connected to the driving circuit IC through the signal lead line B1 or B2.

In an implementation, the signal lead line B1 or B2 may be the first signal wire of the present application. The signal lead line B1 or B2 may be arranged on one layer, or on two or more layers.

In a case that the signal lead line B1 or B2 is arranged on a single layer, the signal lead line B1 or B2 may be arranged in a separate layer different from the layers in the display region, or may also be arranged in a same layer as any one layer in the display region. In an implementation, the signal lead line B1 or B2 may be located on the same layer as the signal transmission wire layer 389 of the display region. In another implementation, the signal lead line B1 or B2 may be located on the same layer as any one of the gate conductive layers of the gate of TFT of the gate drive unit. In another implementation, the signal lead line B1 or B2 may be located on the same layer as any one of the gate conductive layers of the gate of TFT of the gate drive unit and the signal transmission wire layer 389 of the display region. In another implementation, the signal lead line B1 or B2 is located on the same layer as the second gate conductive layer 38532 of the gate of TFT of the gate drive unit and the signal transmission line layer 389 of the display region. In this case, the signal transmission line layer 389, the second gate conductive layer 38532, and the signal lead line B1 or B2 may be simultaneously formed, thereby simplifying the process. In a case that the signal lead line B1 or B2 and the second gate conductive layer 38532 are arranged on the same layer, the gate conductive layer 38532 can be directly connected to the signal lead line B1 or B2, thereby simplifying the process. Alternatively, the signal lead line B1 or B2 may also be electrically connected to the first gate conductive layer 38531 through a via.

In a case that the signal lead line B1 or B2 is arranged on two layers, any one of the two layers of the signal lead line may be arranged on a separate layer different from all the layers in the display region, and may also be arranged on a same layer as any one layer in the display region, as long as the two layers of the signal lead line are not located on the same layer. Specific method for arranging the signal lead line can refer to the description of the first signal wire in the embodiments of the present application. In an implementation, one layer of the signal lead line is located on the same layer as the signal transmission wire layer 389 of the display region. In another implementation, one layer of the signal lead line is located on the same layer as any one layer of the gate of TFT of the gate drive unit. In another implementation, one layer of the signal lead line is located on the same layer as any one layer of the gate of TFT of the gate drive unit and the signal transmission wire layer 389 of the display region. In another implementation, one layer of the signal lead line is located on the same layer as the second gate conductive layer 38532 of TFT and the signal transmission wire layer 389 of the display region. In this case, the signal transmission wire layer 389, the second gate conductive layer 38532, and one layer of the signal lead line may be formed at the same time, thereby simplifying the process. Another layer of the signal lead line may be formed in a separate layer, or may be located on the same layer as any one layer of the display region other than the signal transmission wire layer 389. In a case that one layer of the signal lead line is located on the same layer as the second gate conductive layer 38532, the layer of the signal lead line can be directly connected to the second gate conductive layer 38532, thereby simplifying the process. The signal lead line may also be electrically connected to the gate of TFT in other ways, as long as any one layer of the signal lead line is electrically connected to any one of the gate conductive layers of the gate.

Figure 59:
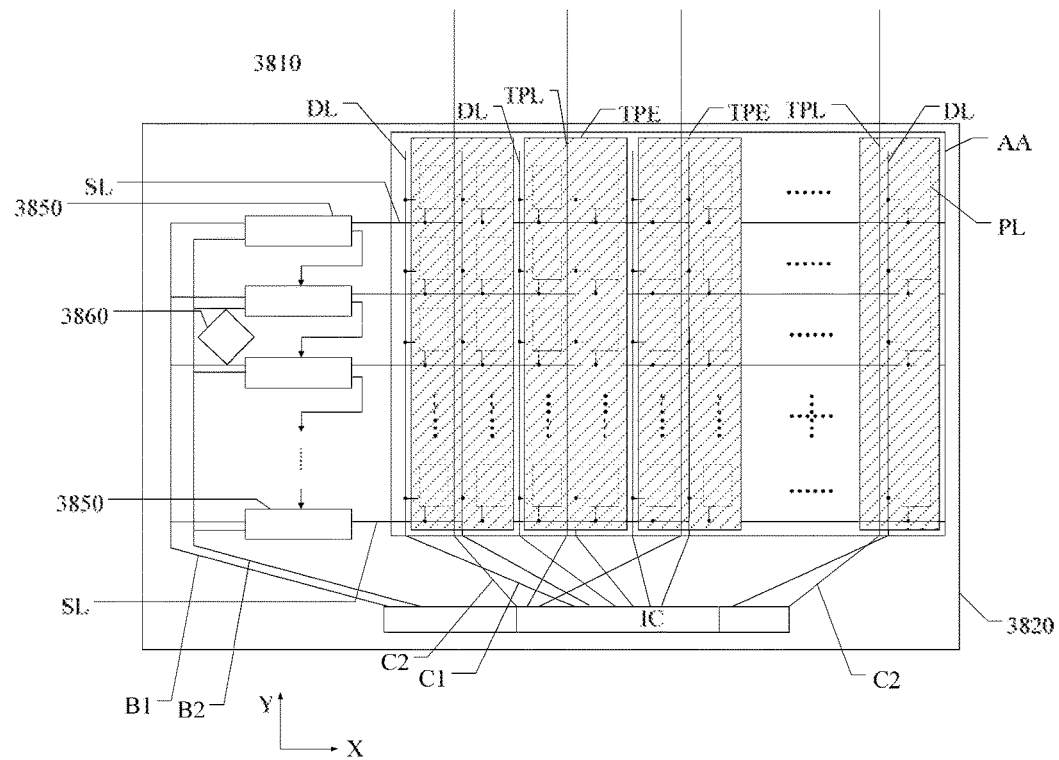
FIG. 59 is a schematic diagram of a display panel integrated with a touch control function and configured with a pressure detecting unit according to an embodiment of the present disclosure.

On the basis of the embodiment as shown in FIG. 38, the display panel 3810 further includes a pressure detecting unit 3860 arranged on the array substrate 3820 configured to detect a touch pressure of a user on the panel. Reference is made to FIG. 59, which schematically illustrates one pressure detecting unit. In practice, two or multiple pressure detecting units can be arranged on the panel.

Figure 60:
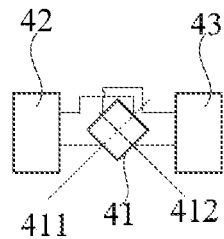
FIG. 60 is a schematic diagram of connection of a pressure detecting unit according to an embodiment of the present disclosure.
Figure 61:
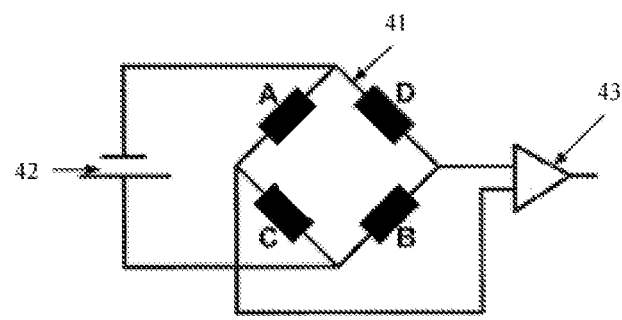
FIG. 61 is an equivalent circuit diagram of a pressure detecting unit as shown in FIG. 60.

FIG. 60 is a schematic diagram of connection of a pressure detecting unit according to another embodiment of the present disclosure. FIG. 61 is an equivalent circuit diagram of a pressure detecting unit as shown in FIG. 60. Reference is made to FIG. 59 to FIG. 61. The pressure detecting unit 3860 may include a semiconductor pressure sensor 41, a bias voltage applying circuit 42 and a voltage detecting circuit 43. The bias voltage applying circuit 42 is electrically connected with a first connecting terminal 4111 and a second connecting terminal 4112 of the semiconductor pressure sensor 41 respectively, and is configured to apply a bias voltage to the semiconductor pressure sensor 41. The voltage detecting circuit 43 is electrically connected with a third connecting terminal 4123 and a fourth connecting terminal 4124 of the semiconductor pressure sensor 41 respectively, and is configured to obtain a force voltage of the semiconductor pressure sensor 41. A first straight line 411 connecting the first connecting terminal 4111 with the second connecting terminal 4112 intersects with a second straight line 412 connecting the third connecting terminal 4123 with the fourth connecting terminal 4124.

The semiconductor pressure sensor 41 is a diffused silicon piezo-resistive pressure sensor. Further illustratively, the semiconductor pressure sensor 41 is a four-terminal diffused silicon piezo-resistive pressure sensor which is formed by forming force resistance gauges on a silicon wafer by ion implantation process and then packaging the same. Compared with a conventional pressure sensor, the above semiconductor pressure sensor has advantages, such as a high output, a small size, automatic temperature compensation, and is easier to be integrated on a touch substrate. If the semiconductor pressure sensor is integrated on the substrate, the area of the semiconductor pressure sensor occupying the substrate is small, and a sensitivity of sensing the touch pressure is high.

Figure 62:
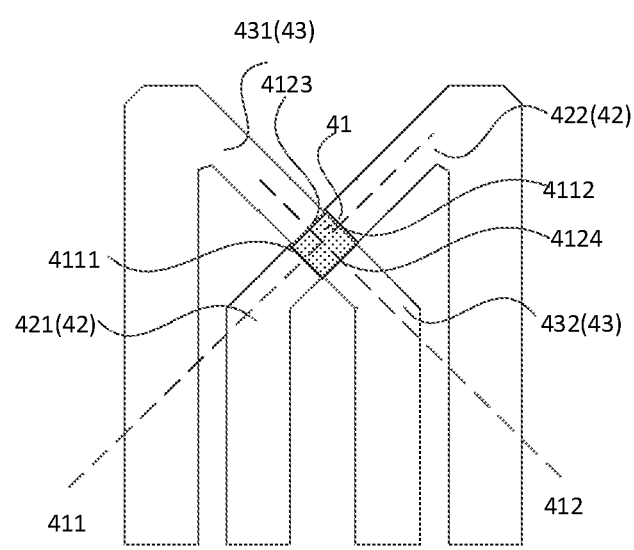
FIG. 62 is a schematic diagram of connection of a semiconductor pressure detecting units according to an embodiment of the present disclosure.

Operating principles of the semiconductor pressure sensor are described below with reference to FIG. 62. As shown in FIG. 62, the bias voltage applying circuit 42 includes a first electrode 421 and a second electrode 422. The first electrode 421 is electrically connected with the first connecting terminal 4111. The second electrode 422 is electrically connected with the second connecting terminal 4112. The voltage detecting circuit 43 includes a third electrode 431 and a fourth electrode 432. The third electrode 431 is electrically connected with the third connecting terminal 4123, and the fourth electrode 432 is electrically connected with the fourth connecting terminal 4124. The first electrode 421 and the second electrode 422 are configured to apply a bias voltage to the semiconductor pressure sensor 41. The third electrode 431 and the fourth electrode 432 are configured to obtain a force voltage of the semiconductor pressure sensor 41.

It should be noted that, in FIG. 562, the semiconductor pressure sensor 41 is a quadrilateral. The first electrode 421 and the second electrode 422 in the bias voltage applying circuit 42 are metal electrodes, and are electrically connected with a first connecting terminal 4111 and a second connecting terminal 4112 on two opposite sides of the semiconductor pressure sensor 41 respectively. Moreover, the third electrode 431 and the fourth electrode 432 in the voltage detecting circuit 43 are both metal electrodes, and are electrically connected with the third connecting terminal 4123 and the fourth connecting terminal 4124 on two additional opposite sides of the semiconductor pressure sensor 41 respectively.

In particular application, after a bias voltage is applied to the semiconductor pressure sensor 41 by using the bias voltage applying circuit 42, namely, through the first electrode 421 and the second electrode 422, when a finger touches the substrate, the whole substrate is deformed, and the impedance of the force resistor gauges is changed, and the force voltage is changed correspondingly. Therefore, the force voltage of the semiconductor pressure sensor 41 can be obtained by using the voltage detecting circuit 43, namely, through the third electrode 431 and the fourth electrode 432, thereby measuring the touch pressure. The measuring the touch pressure can be applied in touch operations, such as touching, releasing, or dragging.

There are multiple connection modes of the semiconductor pressure sensors. As shown in FIG. 562, the semiconductor pressure sensor 41 is a quadrilateral pressure sensor. The first electrode 421, the second electrode 422, the third electrode 431 and the fourth electrode 432 are respectively connected with four sides of the semiconductor pressure sensor 41.

Figure 63:
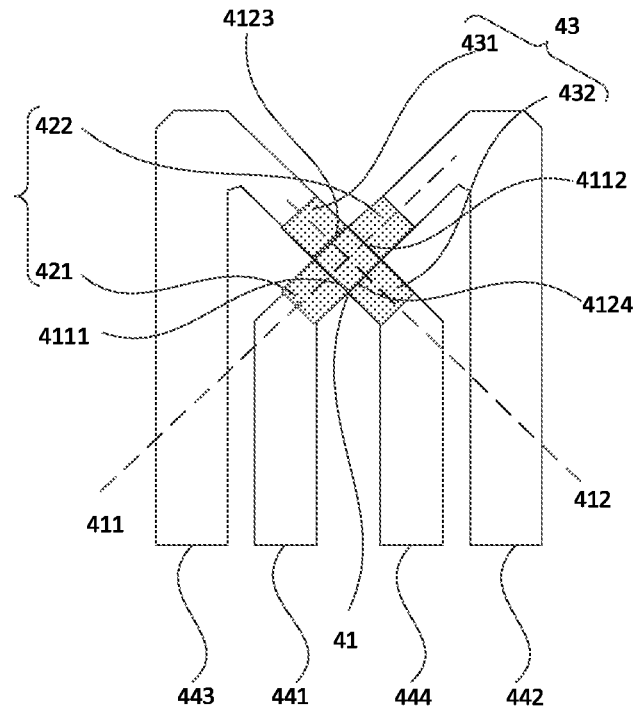
FIG. 63 is a schematic diagram of connection of a semiconductor pressure detecting unit according to an embodiment of the present disclosure.

FIG. 63 is a schematic diagram of connection of semiconductor pressure detecting units according to an embodiment of the present disclosure. As shown in FIG. 63, the semiconductor pressure sensor 41 is a quadrilateral pressure sensor. A first connecting terminal 4111, a second connecting terminal 4112, a third connecting terminal 4123 and a fourth connecting terminal 4124 are arranged on one side of the quadrilateral structure respectively. The bias voltage applying circuit includes a first electrode 421 and a second electrode 422 which are electrically connected with the first connecting terminal 4111 and the second connecting terminal 4112 respectively on two opposite sides of the semiconductor pressure sensor 41. The voltage detecting circuit 43 includes a third electrode 431 and a fourth electrode 432 which are electrically connected with the third connecting terminal 4123 and the fourth connecting terminal 4124 respectively on the other two opposite sides of the semiconductor pressure sensor 41. Different from the embodiment of the FIG. 62, the four electrodes and the semiconductor pressure sensor are made of same material. Such an arrangement can effectively eliminate schottky barriers between the first electrode 421, the second electrode 422, the third electrode 431 and the fourth electrode 432 and the semiconductor pressure sensor, which can further enhance sensitivity of the semiconductor pressure sensor. In addition, as shown in FIG. 63, the four electrodes are externally connected with corresponding metal electrodes respectively. That is, a first metal electrode 141 is arranged at the external of the first electrode 421, a second metal electrode 142 is arranged at the external of the second electrode 422, a third metal electrode 143 is arranged at the external of the third electrode 431, and a fourth metal electrode 144 is arranged at the external of the fourth electrode 432). The first metal electrode 141, the second metal electrode 142, the third metal electrode 143 and the fourth metal electrode 144 are arranged for the purpose of electrically connecting and transmitting a signal between the semiconductor pressure sensor 41 and other circuits (such as a processor) on the substrate 1 conveniently. It should be noted that these are only two specific examples provided by the embodiments of the present disclosure, rather than limiting the present disclosure. In specific designs, the semiconductor pressure sensor 41 may be a polygonal structure including at least four sides, and the first electrode 421, the second electrode 422, the third electrode 431 and the fourth electrode 432 are electrically connected with one side of the semiconductor pressure sensor 41 respectively. Typically, the first straight line 411 connecting the first connecting terminal 4111 with the second connecting terminal 4112 are orthogonal with the second straight line 412 connecting the third connecting terminal 4123 with the fourth connecting terminal 4124.

Figure 64:
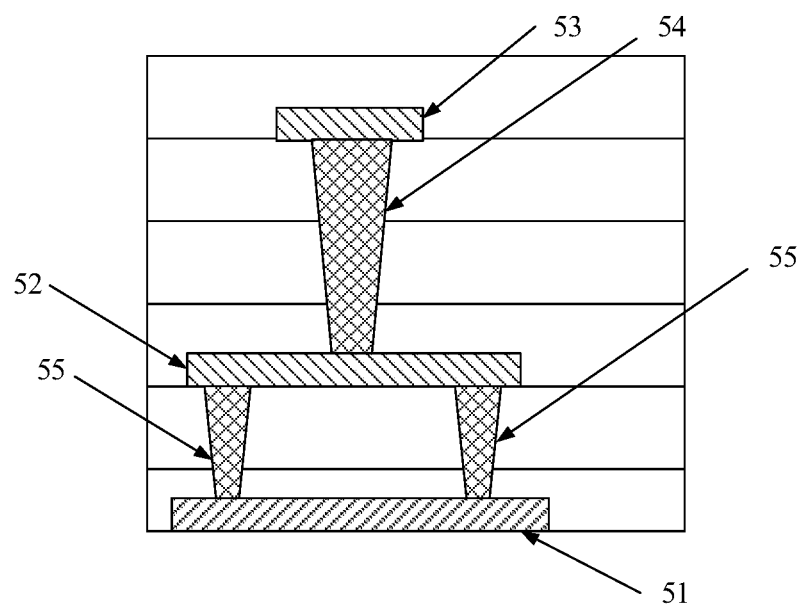
FIG. 64 is a cross-sectional view of a pressure detecting unit according to an embodiment of the present disclosure.

FIG. 64 is a cross-sectional view of a pressure detecting unit according to an embodiment of the present disclosure. The pressure detecting unit has three layers. A first layer 51 is electrically connected to a second layer 52 through a via 55, and the second layer 52 is electrically connected to a third layer 53 through a via 54. In an implementation, the first layer 51 may be a low-temperature poly-silicon layer, the second layer 52 may be a source and drain layer, and the third layer 53 may be a metal electrode layer for forming four electrodes of the semiconductor pressure sensor 41.

Figure 65:
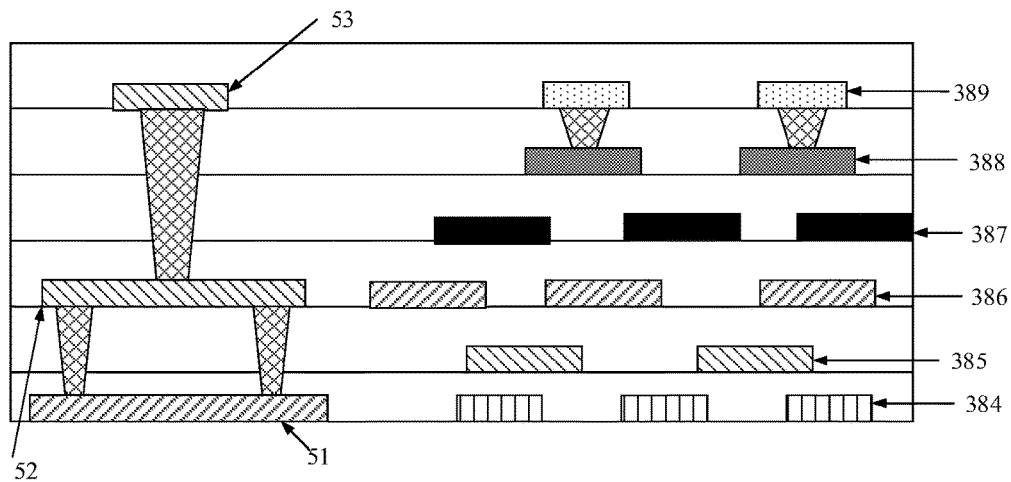
FIG. 65 is a cross-sectional view of a display panel including a display region and a pressure detecting unit in a frame region according to an embodiment of the present disclosure.

Reference is made to FIG. 46, which is cross-sectional view of a display region of an array substrate according to an embodiment of the present disclosure. The display region of the array substrate includes an active layer 384, a gate layer 385, a source and drain layer 386, a pixel electrode layer 387, a common electrode layer 388 and a signal transmission wire layer 389. Any one of the three layers 51, 52, and 53 of the pressure detecting unit according to the embodiment of the present disclosure may be arranged in a separate layer different from all the layers in the display region, or may also be arranged on a same layer as any one layer in the display region, as long as the three layers 51, 52, and 53 of the pressure detecting unit are arranged on different layers. In an embodiment as shown in FIG. 65, the third layer 53 of the pressure detecting unit according to the embodiment of the present disclosure may be arranged on a same layer as the signal transmission wire layer 389 of the display region. In this case, the third layer 53 of the pressure detecting unit is a metal electrode layer configured to form the pressure detecting unit, and the material of the signal transmission wire layer may be selected as the metal electrode layer. Therefore, the metal electrode layer and the signal transmission wire layer may be formed at the same time, thereby simplifying the process. In an embodiment, the second layer 52 of the pressure detecting unit according to the embodiment of the present disclosure may be arranged on a same layer as the source and drain layer 386 of the display region. Therefore, a source and drain layer of the pressure detecting unit and the source and drain layer of the display region are formed at the same time, thereby simplifying the process. In an embodiment, the first layer 51 of the pressure detecting unit according to the embodiment of the present disclosure may be arranged on a same layer as the active layer 384 of the display region. In this case, the material of the active layer 384 is selected as low-temperature poly-silicon such that the first layer 51 of the pressure detecting unit and the active layer 384 of the display region can be formed at the same time.

Figure 66:
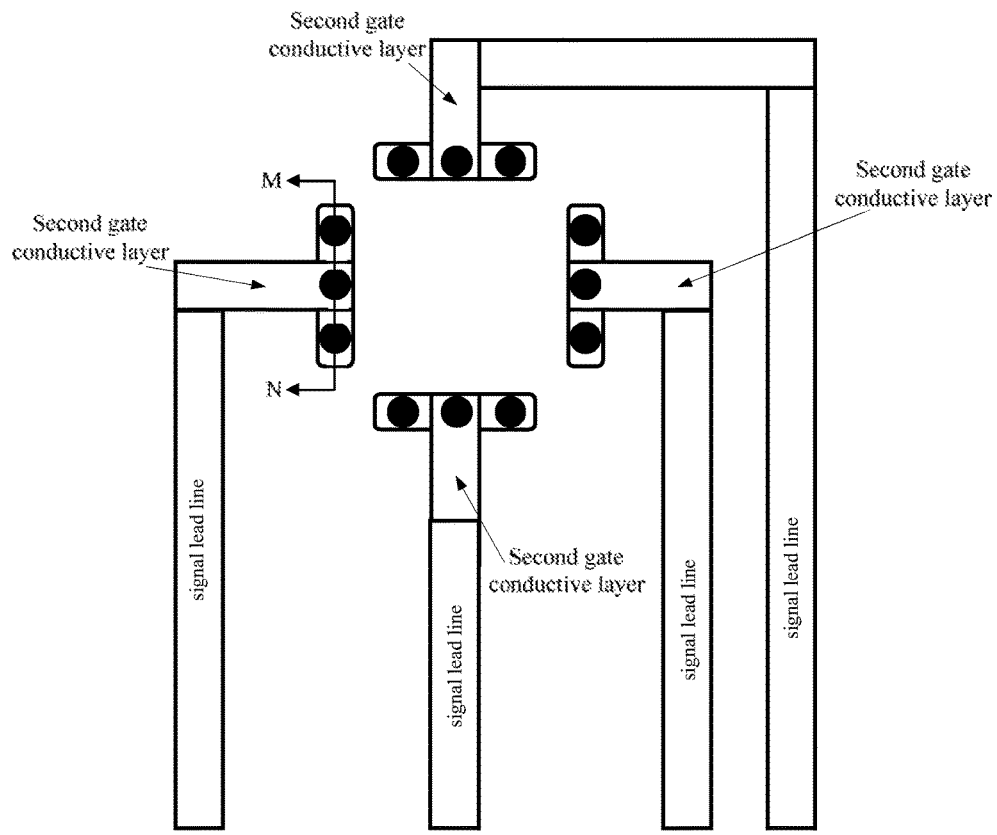
FIG. 66 is a schematic diagram of connection between a pressure detecting unit and a signal lead line according to an embodiment of the present disclosure.

After the pressure detecting unit is formed, the metal electrode of the pressure detecting unit can be made to be electrically connected to the signal lead line B1 or B2 of the gate drive unit, and the metal electrode is further electrically connected to the driving circuit IC through the signal lead line B1 or B2, as shown in FIG. 66.

In an implementation, the signal lead line B1 or B2 may be the first signal wire of the present application. The signal lead line B1 or B2 may be arranged on one layer, or on two or more layers.

Figure 67:
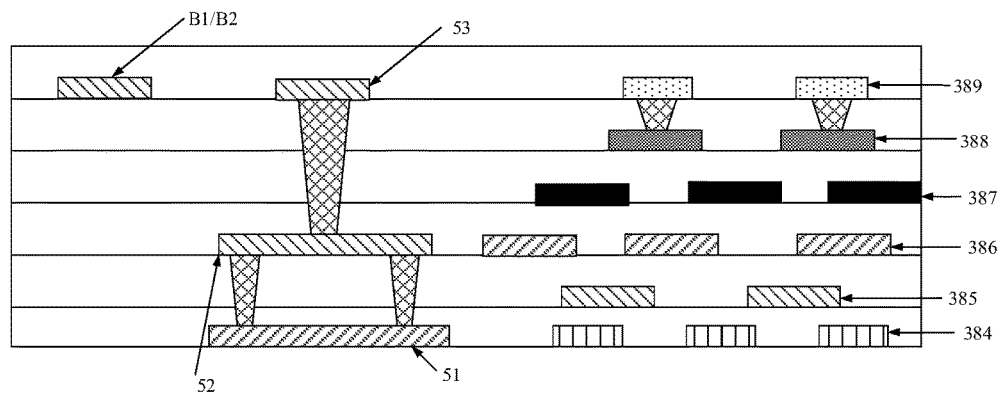
FIG. 67 is a cross-sectional view of a display panel including a display region, and a pressure detecting unit and a signal line in a frame region according to an embodiment of the present disclosure, wherein the left part of the view is a cross-sectional view of the pressure detecting unit and the signal lead line along the MN line as shown in FIG. 66.

In a case that the signal lead line B1 or B2 is arranged on a single layer, the signal lead line B1 or B2 may be arranged in a separate layer different from all the layers in the display region, or may also be arranged on a same layer as any one layer in the display region. In an implementation, the signal lead line B1 or B2 may be located on the same layer as the signal transmission wire layer 389 of the display region. In another implementation, the signal lead line B1 or B2 may be located on the same layer as the third layer (the metal electrode layer) of the pressure detecting unit. In another implementation, the signal lead line B1 or B2 may be located on the same layer as the third layer of the pressure detecting unit and the signal transmission wire layer 389 of the display region, as shown in FIG. 67. In this case, the signal transmission line layer 389, the third layer of the pressure detecting unit, and the signal lead line B1 or B2 may be simultaneously formed, thereby simplifying the process. In a case that the signal lead line B1 or B2 and the third layer of the pressure detecting unit are arranged on the same layer, the third layer may be directly connected to the signal lead line B1 or B2, thereby simplifying the process. Alternatively, the signal lead line B1 or B2 may also be electrically connected to the first layer or the second layer of the pressure detecting unit through a via.

Figure 68:
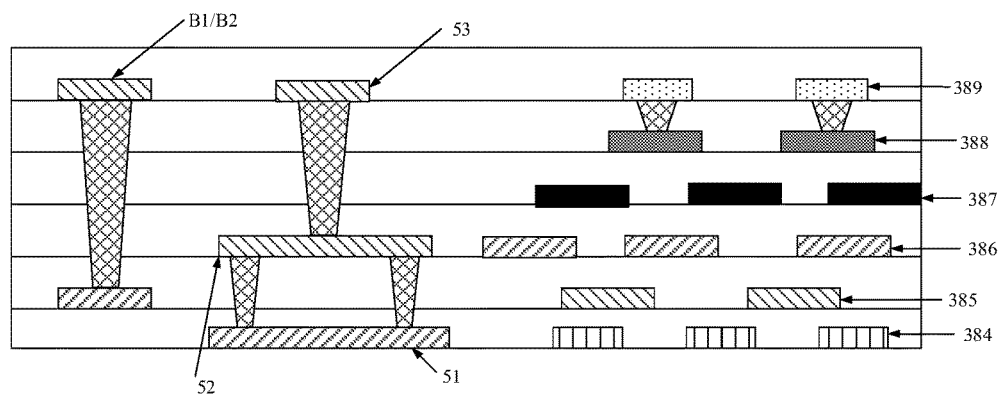
FIG. 68 is a cross-sectional view of a display panel including a display region, and a pressure detecting unit and a signal line in a frame region according to an embodiment of the present disclosure, wherein the left part of the view is a cross-sectional view of the pressure detecting unit and the signal lead line along the MN line as shown in FIG. 66.

In a case that the signal lead line B1 or B2 is arranged on two layers, any one of the two layers of the signal lead line may be arranged on a separate layer different from all the layers in the display region, and may also be arranged on a same layer as any one layer in the display region, as long as the two layers of the signal lead line are not located on the same layer. Specific method for arranging the signal lead line can refer to the description of the first signal wire in the embodiments of the present application. In an implementation, one layer of the signal lead line is located on the same layer as the signal transmission wire layer 389 of the display region. In another implementation, one layer of the signal lead line is located on the same layer as the third layer (the metal electrode layer) of the pressure detecting unit. In another implementation, one layer of the signal lead line is located on the same layer as the third layer of the pressure detecting unit and the signal transmission wire layer 389 of the display region, as shown in FIG. 68. In this case, the signal transmission wire layer 389, the third layer of the pressure detecting unit, and one layer of the signal lead line may be formed at the same time, thereby simplifying the process. Another layer of the signal lead line may be formed in a separate layer, or may be located on the same layer as any one layer of the display region other than the signal transmission wire layer 389. In a case that one layer of the signal lead line is located on the same layer as the third layer of the pressure detecting unit, the layer of the signal lead line can be directly connected to the third layer of the pressure detecting unit, thereby simplifying the process. The signal lead line may also be electrically connected to the pressure detecting unit in other ways, as long as any one layer of the signal lead line is electrically connected to any one layer of the pressure detecting unit.

Various parts of the specification are described in a progressive manner. Emphasis of an embodiment is placed on the part different from other embodiments, and the same parts between various parts can be referred to each other. The various embodiments can be combined with each other without conflict.

With the above descriptions of the disclosed embodiments, these skilled in the art may achieve or use the present disclosure. Various modifications to the embodiments are apparent for the skilled in the art. The general principle herein can be implemented with other embodiments without departing from the spirit or scope of the disclosure. Therefore, the present disclosure should not be limited to the embodiments disclosed herein, but has the widest scope that is in conformity with the principle and the novel features disclosed herein.

What is claimed is:

1. A display panel comprising an array substrate, the array substrate comprising a display region and a frame region,
wherein the display region comprises a signal transmission wire layer,
wherein the frame region comprises a gate circuit drive unit, the gate circuit drive unit comprises a thin film transistor, and the thin film transistor comprises a source, a drain and a gate,
wherein the frame region further comprises a driving circuit and a first signal lead line, the first signal lead line is arranged on a same single layer as the signal transmission wire layer of the display region, wherein one end of the first signal lead line is electrically connected to the gate, and the other end of the first signal lead line is electrically connected to the driving circuit.

2. The display panel according to claim 1, wherein the gate of the thin film transistor comprises: a stack of a first gate conductive layer and a second gate conductive layer, and a first gate insulating layer disposed between the first gate conductive layer and the second gate conductive layer;
wherein a first gate via is arranged between the first gate conductive layer and the second gate conductive layer, and wherein the second gate conductive layer is electrically connected to the first gate conductive layer through the first gate via.

3. The display panel according to claim 2, wherein the second gate conductive layer is located on a same layer as the signal transmission wire layer.

4. The display panel according to claim 3, wherein the display region further comprises an active layer, a gate layer, a source and drain layer, a pixel electrode layer and a common electrode layer, and the active layer, the gate layer, the source and drain layer, the pixel electrode layer, the common electrode layer and the signal transmission wire layer are arranged in a stacked manner.

5. The display panel according to claim 4, wherein the first gate conductive layer is located on a same layer as the gate layer.

6. The display panel according to claim 3, wherein the first signal lead line is electrically connected to the second gate conductive layer.

7. The display panel according to claim 3, wherein the first signal lead line is electrically connected to the first gate conductive layer through a via.

8. The display panel according to claim 2,
wherein the source of the thin film transistor comprises a stack of a first source conductive layer and a second source conductive layer, and a first source insulating layer disposed between the first source conductive layer and the second source conductive layer, wherein a first source via is arranged between the first source conductive layer and the second source conductive layer, and the second source conductive layer is electrically connected to the first source conductive layer via the first source via,
wherein the drain of the thin film transistor comprises a stack of a first drain conductive layer and a second drain conductive layer, and a first drain insulating layer disposed between the first drain conductive layer and the second drain conductive layer, wherein a first drain via is arranged between the first drain conductive layer and the second drain conductive layer, and the second drain conductive layer is electrically connected to the first drain conductive layer via the first drain via, and
wherein the first source conductive layer and the first drain conductive layer are located on a same layer and are formed as a whole.

9. The display panel according to claim 1, wherein the frame region further comprises a second signal lead line, the second signal lead line is arranged on a single layer and arranged on a same layer as the signal transmission wire layer of the display region, one end of the second signal lead line is electrically connected to the source, and the other end of the second signal lead line is electrically connected to the driving circuit.

10. The display panel according to claim 9, wherein the source of the thin film transistor comprises: a first source conductive layer, a second source conductive layer, a third source conductive layer and a fourth source conductive layer, the first source conductive layer is electrically connected with the second source conductive layer through a first source via, the second source conductive layer is electrically connected to the fourth source conductive layer through a second source via, and the third source conductive layer is electrically connected to the fourth source conductive layer through a third source via.

11. The display panel according to claim 10, wherein the fourth source conductive layer is located on a same layer as the signal transmission wire layer.

12. The display panel according to claim 11, wherein the display region further comprises an active layer, a gate layer, a source and drain layer, a pixel electrode layer and a common electrode layer, and the active layer, the gate layer, the source and drain layer, the pixel electrode layer, the common electrode layer and the signal transmission wire layer are arranged in a stack.

13. The display panel according to claim 12, wherein the second source conductive layer and the second drain conductive layer are located on a same layer as the source and drain layer of the display region.

14. The display panel according to claim 11, the second signal lead line is electrically connected to the fourth source conductive layer.

15. The display panel according to claim 11, the second signal lead line is electrically connected to one of the first source conductive layer, the second source conductive layer and the third source conductive layer through a via.

16. The display panel according to claim 11, wherein the drain of the thin film transistor comprises a stack of a first drain conductive layer and a second drain conductive layer, and a first drain insulating layer disposed between the first drain conductive layer and the second drain conductive layer, wherein a first drain via is arranged between the first drain conductive layer and the second drain conductive layer, and the second drain conductive layer is electrically connected to the first drain conductive layer via the first drain via, and
wherein the first source conductive layer and the first drain conductive layer are located on a same layer and are formed as a whole.

17. The display panel according to claim 1, wherein the frame region further comprises a third signal lead line, wherein the third signal lead line is arranged on a single layer and arranged on a same layer as the signal transmission wire layer of the display region, one end of the third signal lead line is electrically connected to the drain, and the other end of the third signal outgoing line is electrically connected to the driving circuit, wherein the drain of the thin film transistor comprises a first drain conductive layer, a second drain conductive layer, a third drain conductive layer and a fourth drain conductive layer, the first drain conductive layer is electrically connected to the second drain conductive layer via a first drain via, the second drain conductive layer is electrically connected to the fourth drain conductive layer via a second drain via, and the third drain conductive layer is electrically connected to the fourth drain conductive layer via a third drain via.

18. The display panel according to claim 1, wherein the display region further comprises a common electrode layer, and the common electrode layer and the signal transmission wire layer are arranged in a stack;

wherein the common electrode layer comprises a plurality of block-shaped sub-electrodes insulated from each other, and the plurality of block-shaped sub-electrodes are arranged in an array and are reused as self capacitance touch control electrodes;

wherein the display panel further comprises: a plurality of touch control signal lines arranged on the array substrate, and the plurality of touch control signal lines are configured to transmit control signals for the plurality of block-shaped sub-electrodes; and wherein the touch control signal lines are arranged on the signal transmission wire layer.

19. The display panel according to claim 1, wherein the display region further comprises a common electrode layer, and the common electrode layer and the signal transmission wire layer are arranged in a stack;

wherein the common electrode layer comprises a plurality of stripe-shaped sub-electrodes;

wherein the display panel further comprises:

a plurality of touch control signal lines arranged on the array substrate, wherein the plurality of touch control signal lines are configured to transmit touch control signals for the plurality of stripe-shaped sub-electrodes, and the plurality of touch control signal lines are arranged on the signal transmission wire layer;

wherein an opposite substrate arranged opposite to the array substrate; and wherein the second stripe-shaped sub-electrodes arranged on the opposite substrate, and the second stripe-shaped sub-electrodes are configured to supply a touch control signal, wherein the second stripe-shaped sub-electrodes are arranged in parallel, and wherein an extension direction of the second stripe-shaped sub-electrodes intersects with an extension direction of the first stripe-shaped sub-electrodes.

20. A touch control display device comprising a display panel, wherein the display panel comprises an array substrate, and the array substrate comprises a display region and a frame region, wherein the display region comprises a signal transmission wire layer, wherein the frame region comprises a gate circuit drive unit, the gate circuit drive unit comprises a thin film transistor, and the thin film transistor comprises a source, a drain and a gate, wherein the frame region further comprises a driving circuit and a first signal lead line, wherein the first signal lead line is arranged on a single layer and arranged on a same layer as the signal transmission wire layer of the display region, wherein one end of the first signal lead line is electrically connected to the gate, and the other end of the first signal lead line is electrically connected to the driving circuit.

* * * * *